US012610545B2

(12) United States Patent
Choi et al.

(10) Patent No.: US 12,610,545 B2
(45) Date of Patent: Apr. 21, 2026

(54) THREE-DIMENSIONAL SEMICONDUCTOR MEMORY DEVICE

(71) Applicant: Samsung Electronics Co., Ltd., Suwon-si (KR)

(72) Inventors: Ji-Hoon Choi, Seongnam-si (KR); Sangmin Kang, Hwaseong-si (KR); Siyeong Yang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 613 days.

(21) Appl. No.: 17/393,781

(22) Filed: Aug. 4, 2021

(65) Prior Publication Data

US 2022/0045097 A1 Feb. 10, 2022

(30) Foreign Application Priority Data

Aug. 5, 2020 (KR) .......................... 10-2020-0098104

(51) Int. Cl.
H10B 43/27 (2023.01)
H10B 41/10 (2023.01)
(Continued)

(52) U.S. Cl.
CPC ............. H10B 43/27 (2023.02); H10B 41/10 (2023.02); H10B 41/27 (2023.02); H10B 41/35 (2023.02);
(Continued)

(58) Field of Classification Search
CPC ........ H10B 43/27; H10B 43/10; H10B 43/35; H10B 43/40; H10B 43/50; H10B 43/30;
(Continued)

(56) References Cited

U.S. PATENT DOCUMENTS 7,151,277 B2 * 12/2006 Gao .................... B81C 1/00595
257/51
9,171,948 B2 10/2015 Mori
(Continued)

FOREIGN PATENT DOCUMENTS

KR 10-1282908 B1 7/2013
KR 10-2019-0132834 A 11/2019

OTHER PUBLICATIONS

Korean Office Action dated Oct. 31, 2024 issued in Korean Patent Application No. 10-2020-0098104.

*Primary Examiner* — William B Partridge
*Assistant Examiner* — Linda J. Fleck
(74) *Attorney, Agent, or Firm* — Harness, Dickey & Pierce, P.L.C.

(57) ABSTRACT

A semiconductor memory device is disclosed. The device may include an electrode structure including electrodes, the electrodes stacked on a substrate, a source semiconductor layer between the substrate and the electrode structure, and a vertical channel structure penetrating the electrode structure. The vertical channel structure includes a vertical insulating pattern, a vertical semiconductor pattern spaced apart from the electrode structure with the vertical insulating pattern interposed between the vertical semiconductor pattern and the electrode structure; and a barrier pattern spaced apart from the electrode structure with the vertical semiconductor pattern interposed between the barrier pattern and the electrode structure. The vertical semiconductor pattern comprises a recess region, the source semiconductor layer extending in the recess region. The barrier pattern includes an insulating layer including carbon.

19 Claims, 19 Drawing Sheets

(51) Int. Cl.

| | |
|---|---|
| *H10B 41/27* | (2023.01) |
| *H10B 41/35* | (2023.01) |
| *H10B 41/40* | (2023.01) |
| *H10B 43/10* | (2023.01) |
| *H10B 43/35* | (2023.01) |
| *H10B 43/40* | (2023.01) |

(52) U.S. Cl.
CPC ............. *H10B 41/40* (2023.02); *H10B 43/10* (2023.02); *H10B 43/35* (2023.02); *H10B 43/40* (2023.02)

(58) Field of Classification Search
CPC ........ H10B 41/10; H10B 41/27; H10B 41/35; H10B 41/40
See application file for complete search history.

(56) References Cited

U.S. PATENT DOCUMENTS

| | | | |
|---|---|---|---|
| 9,177,966 B1 | 11/2015 | Rabkin et al. | |
| 9,419,012 B1 | 8/2016 | Shimabukuro et al. | |
| 9,613,800 B2 | 4/2017 | Go et al. | |
| 9,876,026 B2 | 1/2018 | Lee et al. | |
| 9,899,392 B2 | 2/2018 | Cho et al. | |
| 10,256,247 B1 * | 4/2019 | Kanakamedala ........................... | H01L 21/31111 |
| 10,438,966 B2 | 10/2019 | Shioda et al. | |
| 10,559,466 B2 | 2/2020 | Wells et al. | |
| 10,903,231 B2 | 1/2021 | Lee et al. | |
| 11,056,503 B2 * | 7/2021 | Kim .................... | H01L 23/5226 |
| 2008/0124946 A1 * | 5/2008 | Xiao ................... | H01L 21/3121 |
| | | | 438/784 |
| 2011/0263105 A1 | 10/2011 | Hasebe et al. | |
| 2012/0083077 A1 * | 4/2012 | Yang ...................... | H10B 43/27 |
| | | | 438/479 |
| 2013/0059445 A1 * | 3/2013 | Shao ................... | H01L 21/3065 |
| | | | 257/E21.215 |
| 2017/0084748 A1 * | 3/2017 | Yang ................ | H01L 29/42324 |
| 2018/0261616 A1 * | 9/2018 | Cho ........................ | H10B 41/35 |
| 2019/0189633 A1 * | 6/2019 | Choi ...................... | H10B 41/27 |
| 2019/0355741 A1 * | 11/2019 | Lee ................... | H01L 21/76802 |
| 2020/0075617 A1 | 3/2020 | Saxler | |
| 2020/0152793 A1 * | 5/2020 | Majhi .................... | H10B 41/35 |
| 2020/0185402 A1 * | 6/2020 | Son ........................ | H10B 43/27 |
| 2020/0365614 A1 * | 11/2020 | Kim ..................... | H10B 63/845 |
| 2021/0066337 A1 * | 3/2021 | Xia ........................ | H10B 43/27 |
| 2021/0305266 A1 * | 9/2021 | Lee ....................... | H10B 41/27 |
| 2021/0398847 A1 * | 12/2021 | Parekh ............. | H01L 21/76897 |
| 2022/0045091 A1 * | 2/2022 | Cui ..................... | H01L 29/7926 |
| 2022/0077183 A1 * | 3/2022 | Morita ................... | H10B 43/10 |
| 2022/0127718 A1 * | 4/2022 | Shen ................ | H01L 21/02115 |
| 2022/0310653 A1 * | 9/2022 | Kim ...................... | H10B 43/27 |
| 2022/0344368 A1 * | 10/2022 | Kang ................... | H10B 41/27 |

* cited by examiner

THREE-DIMENSIONAL SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2020-0098104, filed on Aug. 5, 2020, in the Korean Intellectual Property Office, the entire contents of which are hereby incorporated by reference.

BACKGROUND

Some example embodiments relate to a semiconductor device, and in particular, to a three-dimensional semiconductor memory device with improved reliability.

Higher integration of semiconductor devices is required/desired to satisfy consumer demands for superior performance and inexpensive prices. In the case of semiconductor devices, since their integration is an important factor in determining product prices, increased integration is especially desired. In the case of two-dimensional or planar semiconductor devices, since their integration is mainly determined by the area occupied by a cell such as a unit memory cell, integration is greatly influenced by the level of a fine pattern forming technology. However, extremely expensive process equipment used to increase pattern fineness sets a practical limitation on increasing integration for two-dimensional or planar semiconductor devices. To overcome such a limitation, three-dimensional semiconductor memory devices including three-dimensionally arranged memory cells have recently been proposed.

SUMMARY

Some example embodiments of inventive concepts provide a three-dimensional semiconductor memory device with improved reliability.

According to some example embodiments of inventive concepts, a semiconductor memory device may include an electrode structure including electrodes, the electrodes stacked on a substrate, a source semiconductor layer between the substrate and the electrode structure, and a vertical channel structure penetrating the electrode structure. The vertical channel structure includes a vertical insulating pattern, a vertical semiconductor pattern spaced apart from the electrode structure with the vertical insulating pattern interposed between the vertical semiconductor pattern and the electrode structure; and a barrier pattern spaced apart from the electrode structure with the vertical semiconductor pattern interposed between the barrier pattern and the electrode structure. The vertical semiconductor pattern comprises a recess region, the source semiconductor layer extending in the recess region. The barrier pattern includes an insulating layer including carbon.

According to some example embodiments of inventive concepts, a semiconductor memory device may include an electrode structure including electrodes, the electrodes stacked on a substrate, a source semiconductor layer between the substrate and the electrode structure, and a vertical channel structure penetrating the electrode. The vertical channel structure includes a vertical insulating pattern, a vertical semiconductor pattern spaced apart from the electrode structure with the vertical insulating pattern interposed between the vertical semiconductor patter and the electrode structure and, and a barrier pattern spaced apart from the vertical insulating pattern with the vertical semiconductor pattern interposed between the barrier pattern and the vertical semiconductor pattern. The source semiconductor layer sequentially penetrates the vertical insulating pattern and the vertical semiconductor pattern and protrudes toward the barrier pattern. The barrier pattern extends along a side surface of the vertical semiconductor pattern.

According to some example embodiments of inventive concepts, a semiconductor memory device may include a first substrate, a peripheral circuit structure including peripheral transistors on the first substrate, a second substrate on the peripheral circuit structure, an electrode structure including electrodes, the electrodes stacked on the second substrate, a vertical channel structures penetrating the electrode structure and connected to the second substrate, an interlayer insulating layer covering the electrode structure, and a bit line on the interlayer insulating layer, the bit line electrically connected to the vertical channel structures. Each of the vertical channel structures includes a vertical insulating pattern, a vertical semiconductor pattern spaced apart from the electrode structure with the vertical insulating pattern interposed between the vertical semiconductor pattern and the electrode structure, and a barrier pattern spaced apart from the electrode structure with the vertical semiconductor pattern interposed between the barrier pattern and the electrode structure. The vertical semiconductor pattern has a penetration hole in which the second substrate extends. The barrier pattern comprises an insulating layer the insulating layer including carbon.

BRIEF DESCRIPTION OF THE DRAWINGS

Some example embodiments will be more clearly understood from the following brief description taken in conjunction with the accompanying drawings. The accompanying drawings represent non-limiting, example embodiments as described herein.

DETAILED DESCRIPTION

Figure 1:
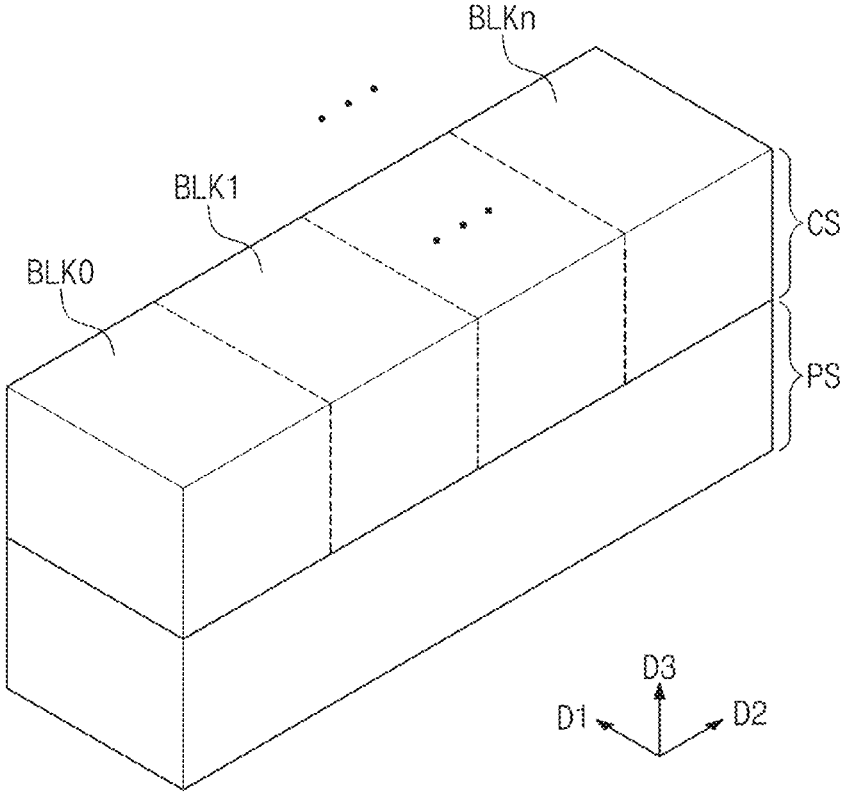
FIG. 1 is a perspective view schematically illustrating a three-dimensional semiconductor memory device according to some example embodiments of inventive concepts.

FIG. 1 is a perspective view schematically illustrating a three-dimensional semiconductor memory device according to some example embodiments of inventive concepts.

Referring to FIG. 1, a three-dimensional semiconductor memory device according to some example embodiments of inventive concepts may include a peripheral circuit structure PS, a cell array structure CS on the peripheral circuit structure PS, and a penetration contact (not shown) vertically connecting the cell array structure CS to the peripheral circuit structure PS. When viewed in a plan view, the cell array structure CS may be overlapped with the peripheral circuit structure PS.

In some example embodiments, the peripheral circuit structure PS may include row decoders and column decoders, a page buffer, control circuits, and peripheral logic circuits. The peripheral logic circuits of the peripheral circuit structure PS may be integrated on a semiconductor substrate; however, example embodiments are not limited thereto, and at least some of the peripheral logic circuits of the peripheral circuit structure PS may be on separate semiconductor substrates.

The cell array structure CS may include a cell array, in which a plurality of memory cells are three-dimensionally arranged. In more detail, the cell array structure CS may include a plurality of memory blocks BLK0 to BLKn. Each of the memory blocks BLK0-BLKn may include a plurality of memory cells, which are three-dimensionally arranged.

Figure 2:
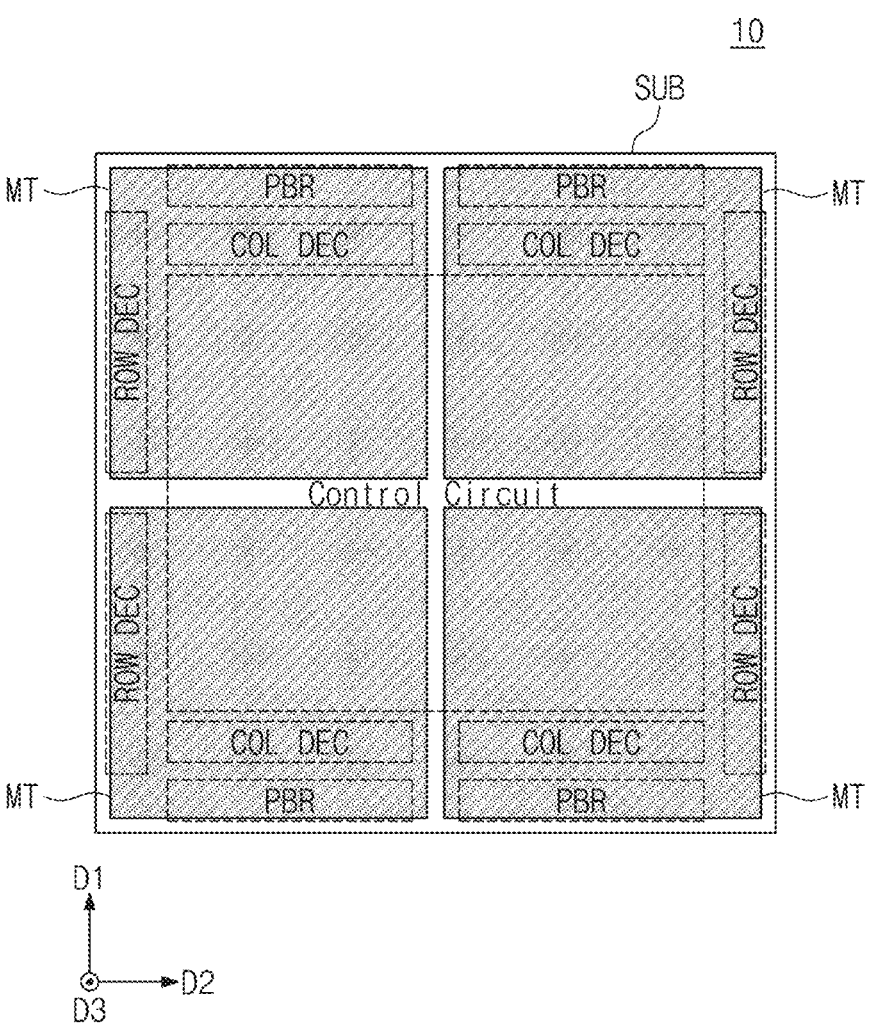
FIG. 2 is a plan view schematically illustrating a three-dimensional semiconductor memory device according to some example embodiments of inventive concepts.

FIG. 2 is a plan view schematically illustrating a three-dimensional semiconductor memory device according to some example embodiments of inventive concepts.

Referring to FIGS. 1 and 2, the peripheral circuit structure PS and the cell array structure CS described with reference to FIG. 1 may be disposed on a first substrate SUB. Row and column decoders ROW DEC and COL DEC, a page buffer PBR, and control circuits, which constitute/are included in the peripheral circuit structure PS (e.g., see FIG. 1), may be disposed in each of chip regions 10 and on the first substrate SUB.

A plurality of planes or mats MT constituting/included in the cell array structure CS (e.g., see FIG. 1) may be disposed on the first substrate SUB. The mats MT may be arranged in a first direction D1 and a second direction D2. Each of the mats MT may include the memory blocks BLK0 to BLKn previously described with reference to FIG. 1.

The mats MT may be disposed to be overlapped with the peripheral circuit structure PS (e.g., see FIG. 1). In some example embodiments, the peripheral logic circuits included in the peripheral circuit structure PS (e.g., see FIG. 1) may be freely disposed below the mats MT.

Figure 3:
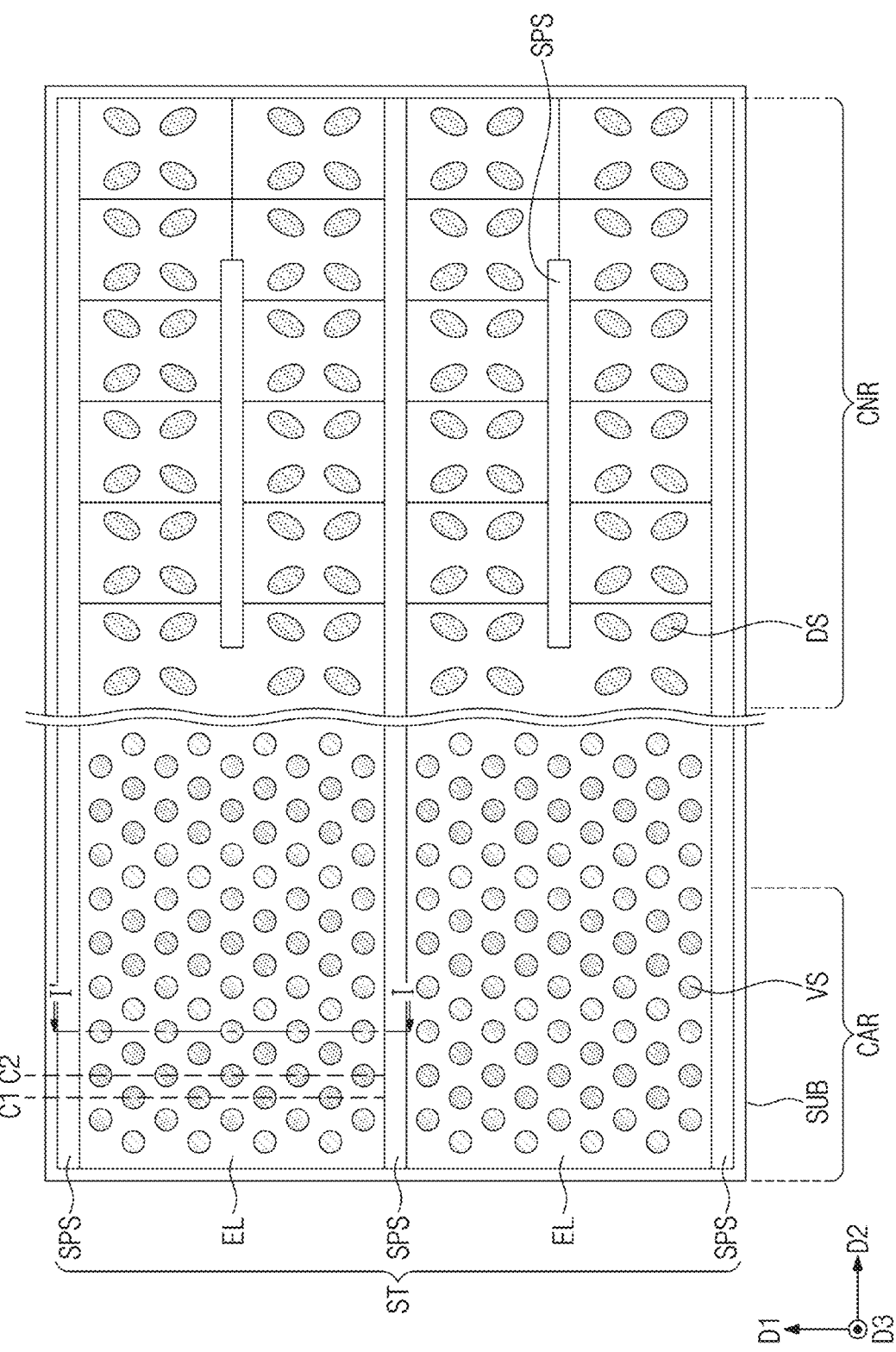
FIG. 3 is a plan view illustrating a three-dimensional semiconductor memory device according to some example embodiments of inventive concepts.
Figure 4:
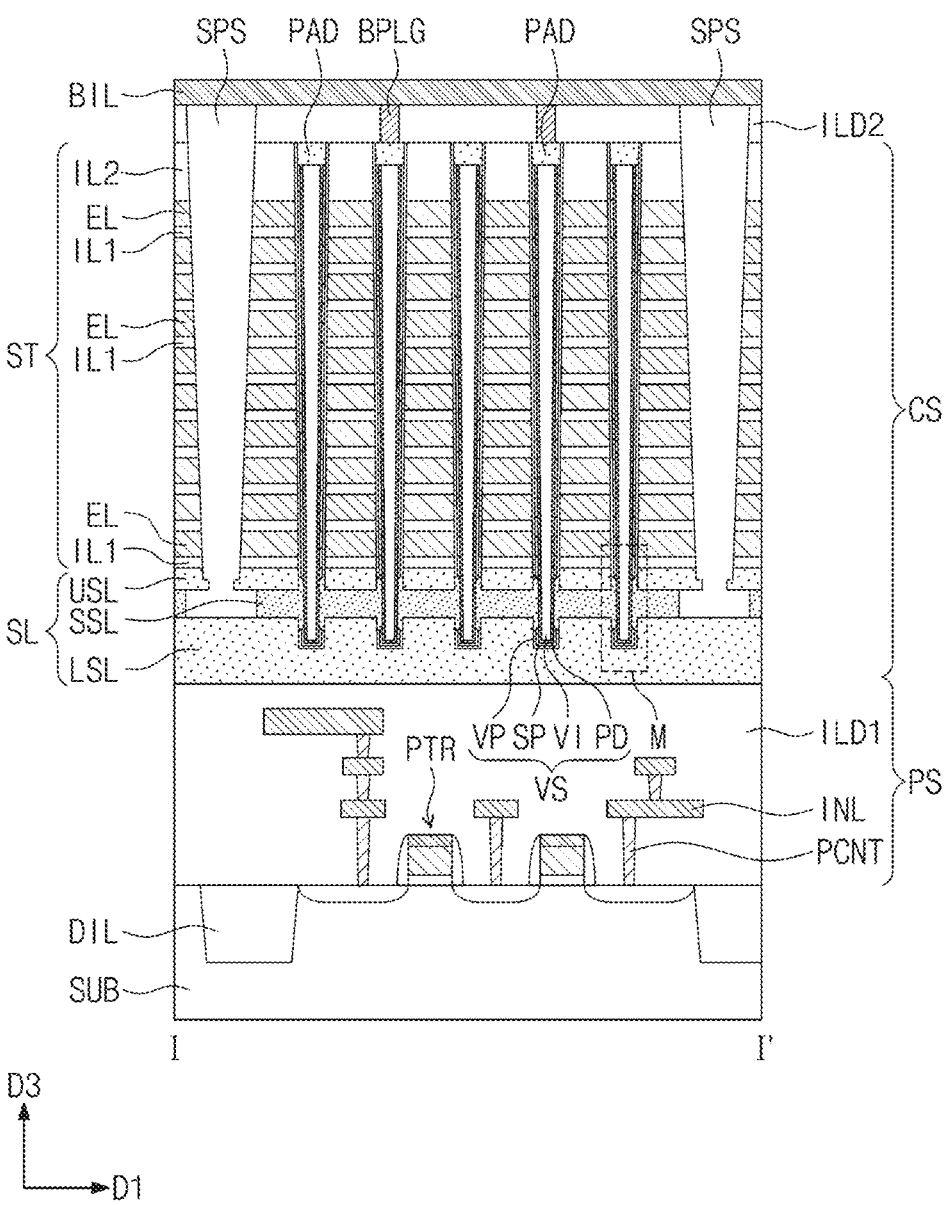
FIG. 4 is a sectional view taken along a line I-I' of FIG. 3.
Figure 5:
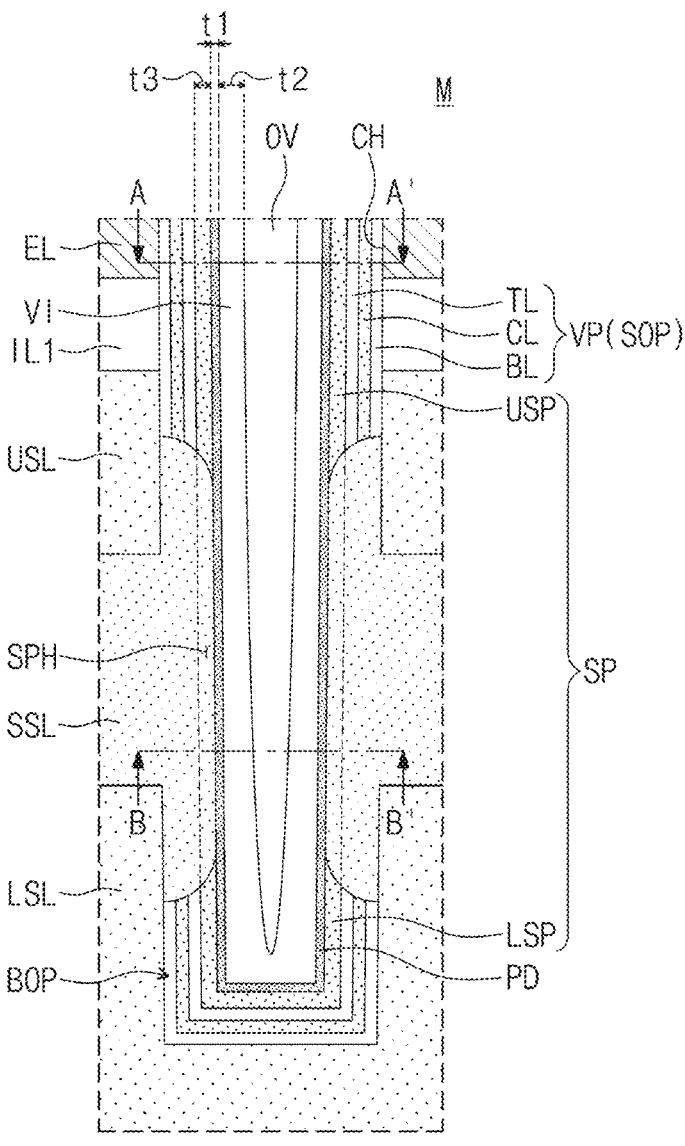
FIG. 5 is an enlarged sectional view of a portion M of FIG. 4.
Figure 6:
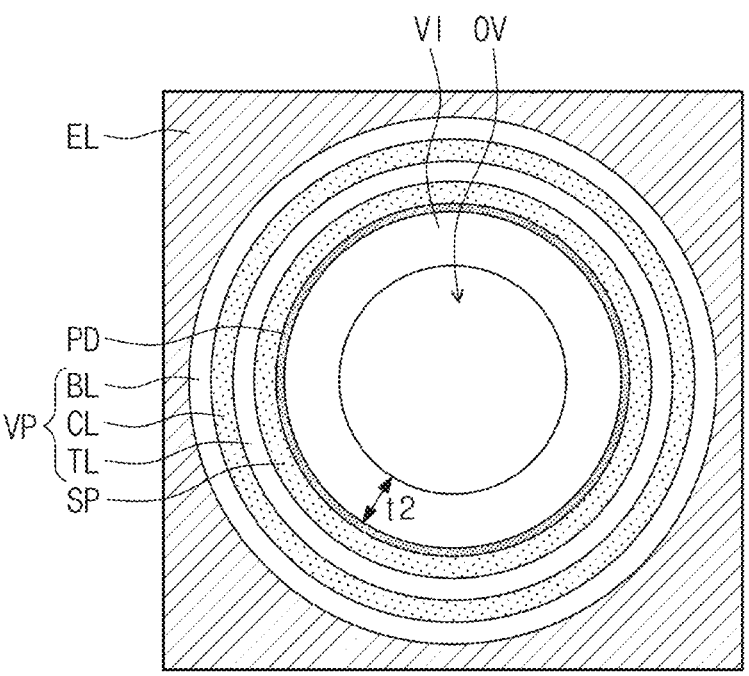
FIGS. 6 and 7 are plan views taken along a line A-A' of FIG. 5.
Figure 7:
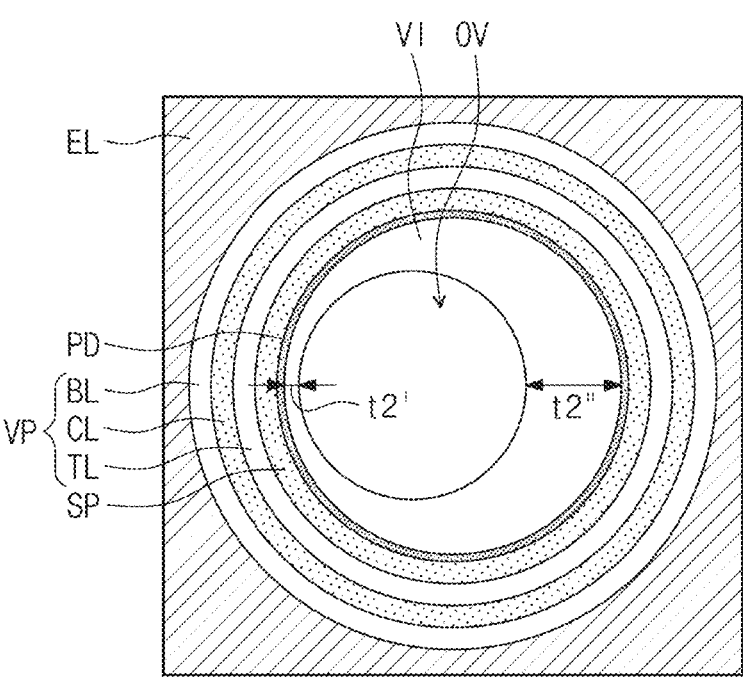
Figure 8:
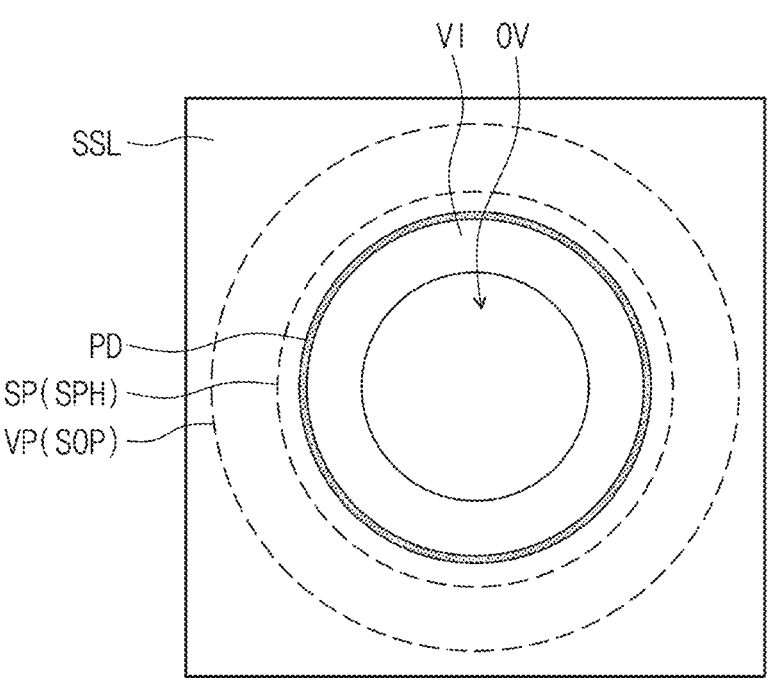
FIGS. 8 and 9 are plan views taken along a line B-B' of FIG. 5.
Figure 9:
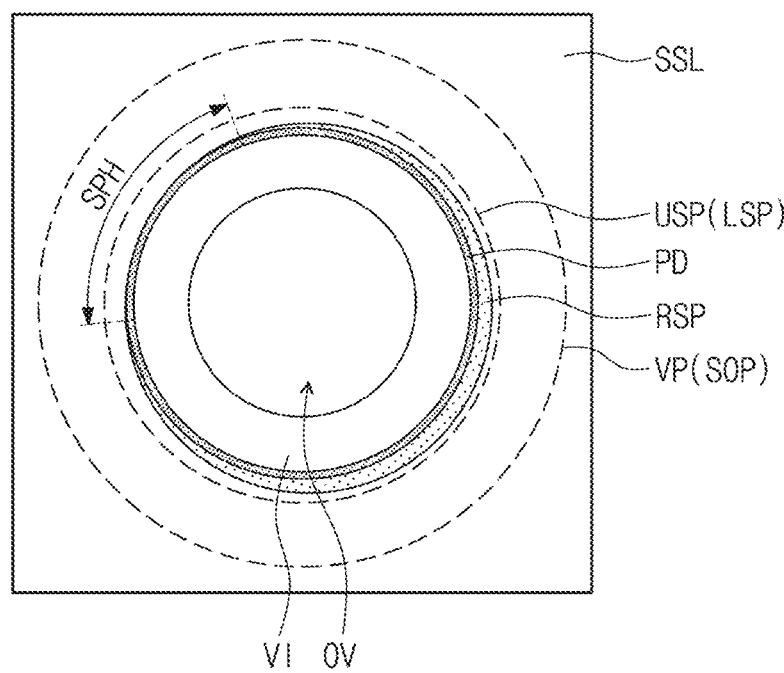

FIG. 3 is a plan view illustrating a three-dimensional semiconductor memory device according to some example embodiments of inventive concepts. FIG. 4 is a sectional view taken along a line I-I' of FIG. 3. FIG. 5 is an enlarged sectional view of a portion M of FIG. 4. FIG. 3 exemplarily illustrates a memory cell structure provided in one of the mats MT of FIG. 2. FIGS. 6 and 7 are plan views taken along a line A-A' of FIG. 5. FIGS. 8 and 9 are plan views taken along a line B-B' of FIG. 5.

Referring to FIGS. 3 to 5, the peripheral circuit structure PS including peripheral transistors PTR may be disposed on the first substrate SUB. The cell array structure CS including an electrode structure ST may be disposed on the peripheral circuit structure PS. The first substrate SUB may be or include a silicon substrate, a silicon germanium substrate, a germanium substrate, or a single crystalline epitaxial layer grown on a single crystalline silicon substrate, and may be doped, e.g. lightly doped with impurities such as boron. The first substrate SUB may include active regions defined by a device isolation layer DIL.

The peripheral circuit structure PS may include the peripheral transistors PTR disposed on the active regions of the first substrate SUB. As described above, the peripheral transistors PTR may constitute or be included in the row and column decoders, the page buffer, the control circuit, the peripheral logic circuit, and/or the like.

The peripheral circuit structure PS may include lower interconnection lines INL, which are provided on, e.g. connecting or directly connecting to, the peripheral transistors PTR, and a first interlayer insulating layer ILD1, which is provided to cover the peripheral transistors PTR and the lower interconnection lines INL. A peripheral contact PCNT may be provided between the lower interconnection line INL and the peripheral transistor PTR to connect, e.g. directly connect, the lower interconnection line INL and the peripheral transistors PTR. The first interlayer insulating layer ILD1 may include a plurality of stacked insulating layers. For example, the first interlayer insulating layer ILD1 may include at least one of silicon oxide layer, a silicon nitride layer, a silicon oxynitride layer, and/or a low-k dielectric layer.

The cell array structure CS may be provided on the first interlayer insulating layer ILD1 of the peripheral circuit structure PS. The cell array structure CS will be described in more detail below. A second substrate SL may be provided on the first interlayer insulating layer ILD1. As an example, the second substrate SL may be a rectangular plate constituting/corresponding to a lower portion of the mat MT of FIG. 2. The second substrate SL may support the electrode structure ST, which is provided thereon.

The second substrate SL may include a lower semiconductor layer LSL, a source semiconductor layer SSL, and an upper semiconductor layer USL, which are sequentially stacked. Each of the lower semiconductor layer LSL, the source semiconductor layer SSL, and the upper semiconductor layer USL may be formed of or include at least one semiconductor material (e.g., silicon (Si), germanium (Ge), silicon germanium (SiGe), gallium arsenic (GaAs), indium gallium arsenic (InGaAs), aluminum gallium arsenic (AlGaAs), or mixtures thereof). The semiconductor material may be doped or undoped; however, example embodiments are not limited thereto. Each of the lower semiconductor layer LSL, the source semiconductor layer SSL, and the upper semiconductor layer USL may have a single crystalline structure, an amorphous structure, and/or a polycrystalline structure. As an example, each of the lower semiconductor layer LSL, the source semiconductor layer SSL, and the upper semiconductor layer USL may be or include an n-type doped polysilicon layer, e.g. a polysilicon layer including n-type dopants such as phosphorus and/or arsenic. The lower semiconductor layer LSL, the source semiconductor layer SSL, and the upper semiconductor layer USL may have impurity concentrations different from each other. For example, the impurity concentration of the source semiconductor layer SSL may be higher than the impurity concentration of each of the lower and upper semiconductor layers LSL and USL.

The second substrate SL may include a cell array region CAR and a connection region CNR. The cell array region CAR may be provided overlapping with a center of the second substrate SL. The connection region CNR may be disposed near at least one of sides of the cell array region CAR. The source semiconductor layer SSL may be interposed between the lower semiconductor layer LSL and the upper semiconductor layer USL. The lower semiconductor layer LSL and the upper semiconductor layer USL may be electrically connected to each other through the source semiconductor layer SSL.

The electrode structure ST may include electrodes EL, which are stacked in a direction (e.g., a third direction D3) perpendicular to the second substrate SL. The electrode structure ST may further include first insulating layers IL1, each of which separates the stacked electrodes EL from each other. A number of layers of stacked electrodes may be variable, and may be more than or less than the number illustrated in FIG. 4. In the electrode structure ST, the first insulating layers IL1 and the electrodes EL may be alternately stacked in the third direction D3. A second insulating layer IL2 may be provided at the highest level of the electrode structure ST. The second insulating layer IL2 may be thicker than each of the first insulating layers IL1.

The electrode structure ST may be extended from the cell array region CAR to the connection region CNR. The electrode structure ST may have a stepwise structure, e.g. a staircase structure, on the connection region CNR. The stepwise structure of the electrode structure ST may have a thickness or height decreasing with increasing distance from the cell array region CAR. For example, the stepwise structure of the electrode structure ST may have a decreasing thickness and/or height in a direction away from the cell array region CAR or in the second direction D2.

The lowermost one of the electrodes EL of the electrode structure ST may be or correspond to a lower selection line. The uppermost one of the electrodes EL of the electrode structure ST may be or correspond to an upper selection line. All of the electrodes EL, other than the lower and upper selection lines, may be or correspond to word lines.

Each of the electrodes EL may be formed of or include at least one of doped semiconductor materials (e.g., doped silicon such as polysilicon doped with N-type and/or P-type impurities), metallic materials (e.g., tungsten, copper and/or aluminum), conductive metal nitrides (e.g., titanium nitride and/or tantalum nitride), or transition metals (e.g., titanium and/or tantalum). Each of the first and second insulating layers IL1 and IL2 may include a silicon oxide layer.

A plurality of vertical channel structures VS may be provided on the cell array region CAR to penetrate the electrode structure ST. As an example, referring to FIG. 3, the may include a plurality of first columns C1, each of which consists of four vertical channel structures VS arranged in the first direction D1, and a plurality of second columns C2, each of which consists of five vertical channel structures VS arranged in the first direction D1. The first and second columns C1 and C2 may be repeatedly and alternately arranged in the second direction D2. A diameter of each of the vertical channel structures VS may decrease with decreasing distance from the second substrate SL. The vertical channel structures VS may be arranged such that respective centers of the vertical channel structures VS are in a repeating pattern, such as a repeating triangular lattice, a repeating rectangular (e.g. square) lattice, and/or a repeating hexagonal lattice.

The three-dimensional semiconductor memory device according to some example embodiments of inventive concepts may be or correspond to or include a three-dimensional NAND FLASH memory device. NAND cell strings may be integrated in the electrode structure ST on the second substrate SL. For example, the electrode structure ST and the vertical channel structures VS penetrating the same may constitute or correspond to a plurality of memory cells, which are three-dimensionally arranged on the second substrate SL. The electrodes EL of the electrode structure ST may be used as gate electrodes of cell transistors of the three-dimensional NAND FLASH memory device.

Dummy structures DS may be provided on the connection region CNR to penetrate the electrode structure ST. The dummy structures DS may be provided to penetrate the stepwise structure of the electrode structure ST. The dummy structures may not be electrically active, e.g. may be floating during operation of the semiconductor device. When viewed in a plan view, each of the dummy structures DS may have a size (e.g., a major axis or the largest diameter or an area) that is larger than that of each of the vertical channel structures VS.

The vertical channel structures VS may be respectively provided in channel holes CH penetrating the electrode structure ST. Each of the vertical channel structures VS may include a vertical insulating pattern VP, a vertical semiconductor pattern SP, and a barrier pattern PD. The vertical semiconductor pattern SP may be interposed between the vertical insulating pattern VP and the barrier pattern PD. A conductive pad may be provided on or in an upper portion of each of the vertical channel structures VS.

The vertical semiconductor pattern SP may be spaced apart from the electrodes EL with the vertical insulating pattern VP interposed therebetween. The barrier pattern PD may be spaced apart from the vertical insulating pattern VP with the vertical semiconductor pattern SP interposed therebetween. For example, the vertical insulating pattern VP, the vertical semiconductor pattern SP, and the barrier pattern PD may be sequentially provided in the channel hole CH. The vertical channel structure VS may include an insulating gapfill pattern VI, which is spaced apart from the vertical semiconductor pattern SP with the barrier pattern PD interposed therebetween. The insulating gapfill pattern VI may have a circular pillar shape and/or a pipe shape.

The vertical semiconductor pattern SP may be shaped like a pipe with an open top end, and may taper towards a bottom end. The vertical insulating pattern VP may cover an outer surface of the vertical semiconductor pattern SP. The barrier pattern PD may cover an inner surface of the vertical semiconductor pattern SP. Each of the vertical insulating pattern VP and the barrier pattern PD may be shaped like a pipe with an open top end.

The vertical insulating pattern VP may consist of a single thin film or a plurality of thin films. In some example embodiments, the vertical insulating pattern VP may include a data storing layer. Alternatively or additionally, in some example embodiments, the vertical insulating pattern VP may include a tunnel insulating layer TL, a charge storing layer CL, and a blocking insulating layer BL, which are used as the data storing layer of the NAND FLASH memory device.

For example, the charge storing layer CL may be or include at least one of a trap insulating layer, a floating gate electrode, or an insulating layer with conductive nanodots. The charge storing layer CL may include at least one of a silicon nitride layer, a silicon oxynitride layer, a silicon-rich nitride layer, a nanocrystalline silicon layer, and a laminated trap layer. The tunnel insulating layer TL may be formed of or include a material whose band gap is greater than the charge storing layer CL. The tunnel insulating layer TL may be formed of or include high-k dielectric materials (e.g., aluminum oxide and hafnium oxide) or silicon oxide. The blocking insulating layer BL may be formed of or include silicon oxide and/or aluminum oxide.

The vertical semiconductor pattern SP may be formed of or include at least one of semiconductor materials (e.g., silicon (Si), germanium (Ge), or mixtures thereof) in single-crystal or polycrystalline phase. Alternatively or additionally, the vertical semiconductor pattern SP may be formed of or include a doped semiconductor material or an undoped intrinsic semiconductor material. The vertical semiconductor pattern SP including the semiconductor material may be used as or correspond to a channel region of the cell transistors of the NAND cell string.

The conductive pad PAD may cover a top surface of the vertical semiconductor pattern SP and a top surface of the insulating gapfill pattern VI. The conductive pad PAD may be formed of or include doped semiconductor materials and/or metallic materials. A bit line contact plug BPLG may be electrically connected to the vertical semiconductor pattern SP through the conductive pad PAD.

The source semiconductor layer SSL may be in contact with, e.g. in direct contact with a lower portion of each of the vertical semiconductor patterns SP. The source semiconductor layer SSL may electrically connect the vertical semiconductor patterns SP on the cell array region CAR to each other. For example, the vertical semiconductor patterns SP of the vertical channel structures VS may be electrically connected to the source semiconductor layer SSL. A common source voltage may be applied to the source semiconductor layer SSL.

Each of the dummy structures DS may include the vertical insulating pattern VP, the vertical semiconductor pattern SP, and the insulating gapfill pattern VI, similar to the vertical channel structures VS. The dummy structures DS may not serve as the channel region of the memory cell, unlike the vertical channel structures VS. The dummy structures DS may not be electrically connected to bit lines BIL, which will be described below. For example, the dummy structures DS may be or correspond to a dummy that does not have any function in terms of a circuit. The dummy structures DS may be used as a pillar (e.g., a supporter) that supports the stepwise structure of the electrode structure ST mechanically, and/or may be used to improve margins such as photolithographic margins.

A plurality of separation structures SPS may be provided to penetrate the electrode structure ST. The separation structures SPS may be extended in a second direction D2 and may be parallel to each other. When viewed in a plan view, each of the separation structures SPS may be a line- or bar-shaped pattern extending in the second direction D2. For example, referring to FIG. 4, each electrode EL may be horizontally divided into the plurality of electrodes EL by the separation structures SPS. The separation structures SPS may be formed of or include at least one insulating materials (e.g., silicon oxide and/or silicon nitride).

A second interlayer insulating layer ILD2 may be provided on the electrode structure ST. The bit line contact plugs BPLG may be provided to penetrate the second interlayer insulating layer ILD2 and may be respectively coupled to the conductive pads PAD. The bit lines BIL may be disposed on the second interlayer insulating layer ILD2. The bit lines BIL may be extended in the first direction D1 and may be parallel to each other. The bit lines BIL may be electrically connected to the vertical channel structures VS, respectively, through the bit line contact plugs BPLG.

Cell contact plugs may be respectively coupled to the electrodes EL, which are provided to form the stepwise structure. A plurality of upper interconnection lines may be disposed on the cell contact plugs. Although not shown, the bit lines BIL and the upper interconnection lines may be electrically connected to the lower interconnection lines INL of the peripheral circuit structure PS through penetration contacts.

A lower portion of the vertical channel structure VS will be described in more detail with reference to FIGS. 5 to 9.

Figure 13:
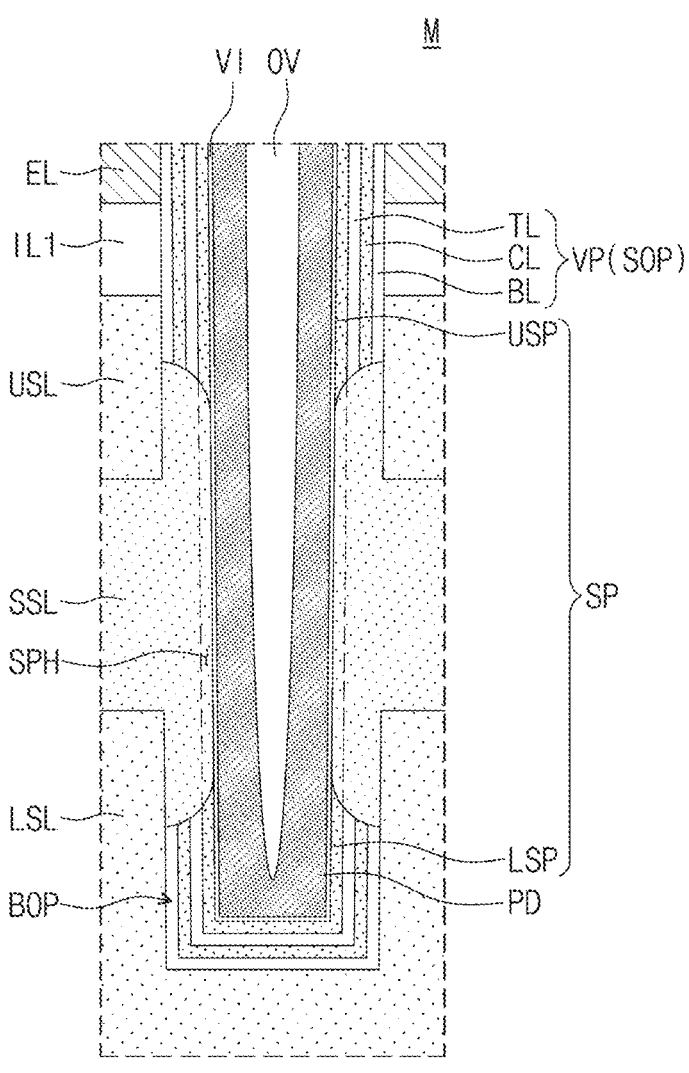
Figure 14:
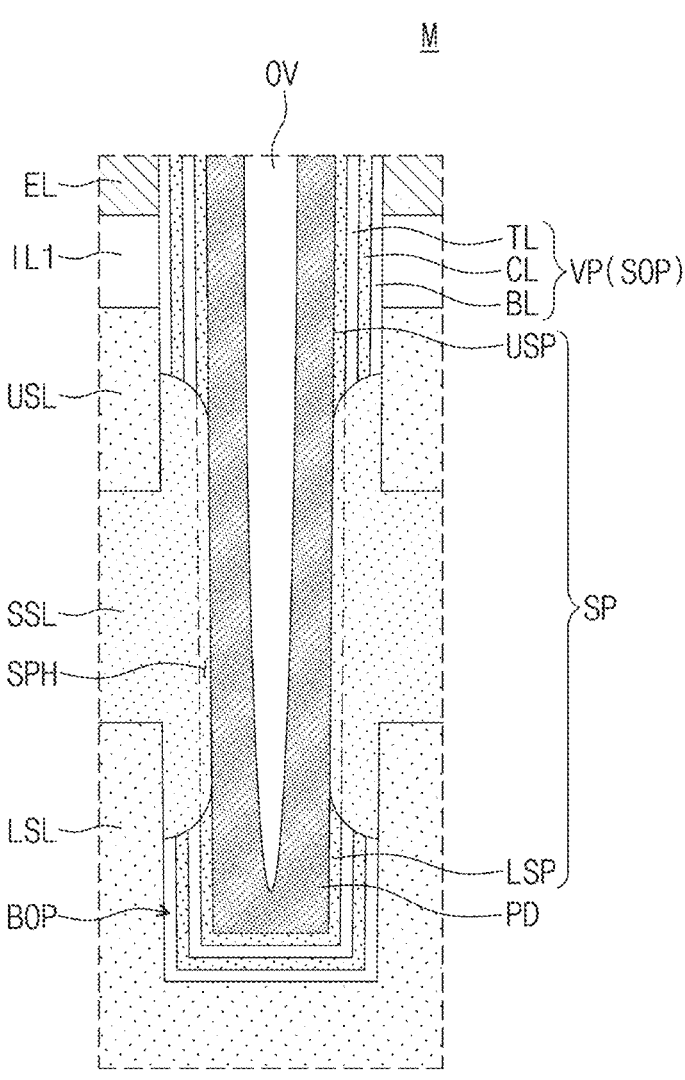

The lower portion of the vertical channel structure VS may include an air gap OV. As an example, at least a portion of the air gap OV may be disposed at the same level as the source semiconductor layer SSL. The air gap OV may be extended to the upper portion of the vertical channel structure VS, but in some example embodiments, the air gap OV may be locally provided in the lower portion of the vertical channel structure VS. The air gap OV may be a region in which a solid material is not provided, and may be a space, which is in a vacuum state or is filled with a gaseous material. The vacuum state may correspond to a state having a pressure less than atmospheric pressure. The gaseous material may be or include air, such as clean, dry air (CDA). The air gap OV may be spatially defined by the insulating gapfill pattern VI enclosing the same, but in some example embodiments, the air gap OV may be spatially defined by the barrier pattern PD, not by the insulating gapfill pattern VI, as shown in FIGS. 13 and 14.

The source semiconductor layer SSL may be horizontally extended to penetrate the vertical insulating pattern VP. The vertical insulating pattern VP may be divided into a lower pattern BOP and an upper pattern SOP by the source semiconductor layer SSL interposed therebetween. A thickness of the source semiconductor layer SSL in the third direction D3 may be greater in a region between the lower pattern BOP and the upper pattern SOP than in other regions (e.g., under the upper semiconductor layer USL). As an example, the source semiconductor layer SSL may include portions vertically protruding toward the lower pattern BOP and the upper pattern SOP.

The vertical semiconductor pattern SP may include a recess region which is formed in a lower portion, and the source semiconductor layer SSL may extend into the recess region. The recess region may be provided in the form of a first penetration hole SPH penetrating the lower portion of the vertical semiconductor pattern SP. The recess region may correspond to a mushroom-shaped region, e.g. to a region having a shape of a mushroom on its side. Furthermore, as shown in FIG. 8, the first penetration hole SPH may have, for example, an annular shape or a ring shape and may divide the vertical semiconductor pattern SP completely into two portions in the third direction D3. Thus, when viewed in the plane view taken at a level B-B' of FIG. 5, the vertical semiconductor pattern SP may be completely removed, and a side surface of the barrier pattern PD may be exposed through the first penetration hole SPH. The vertical semiconductor pattern SP may include a lower semiconductor pattern LSP and an upper semiconductor pattern USP. The lower semiconductor pattern LSP and the upper semiconductor pattern USP may be separated from each other with the first penetration hole SPH interposed therebetween.

In some example embodiments, when viewed in the plane view taken at the level B-B' as shown in FIG. 9, the first penetration hole SPH may be locally formed on a portion of the vertical semiconductor pattern SP, and a residual semiconductor pattern RSP may cover a portion of the side surface of the barrier pattern PD. The lower semiconductor pattern LSP and the upper semiconductor pattern USP may not be completely separated from each other by the first penetration hole SPH and may be connected to/continuous with each other through the residual semiconductor pattern RSP. The following description will refer to the structure shown in FIG. 8, but example embodiments are not limited thereto.

The source semiconductor layer SSL may extend into the first penetration hole SPH. In example embodiments of FIG. 5, the source semiconductor layer SSL may be in contact with the barrier pattern PD. The barrier pattern PD may be extended along a side surface of the source semiconductor layer SSL. For example, the barrier pattern PD may not be pierced by the source semiconductor layer SSL. A lower portion of the insulating gapfill pattern VI may be spaced apart from the source semiconductor layer SSL with the barrier pattern PD interposed therebetween.

The insulating gapfill pattern VI may be formed of or include at least one of silicon oxide and/or silicon oxyni-tride. The barrier pattern PD may be formed of or include a material, which has a high etch resistance property to an etchant (e.g. a chemical etchant such as a wet etchant) which is used in an etching process to form the source semicon-ductor layer SSL, compared with the insulating gapfill pattern VI. In some example embodiments, the barrier pattern PD may contain carbon. The carbon concentration of the barrier pattern PD may be large enough to affect the etch resistance of the barrier pattern with respect to etchants used to form the source semiconductor layer SSL, as compared with the insulating gapfill pattern VI. The barrier pattern PD may have higher carbon concentration than the insulating gapfill pattern VI. The carbon concentration of the barrier pattern PD may range from about 1.5 at % to about 4.0 at %. In some example embodiments, the barrier pattern PD may be formed of or include at least one of SiC, SiCN, SiOC, or SiOCN. In some example embodiments, a nitrogen concen-tration of the barrier pattern PD may range from about 0.5 at % to about 1.5 at %.

Referring to FIG. 5, a thickness t1 of the barrier pattern PD may be less than a thickness t2 of the insulating gapfill pattern VI and may be less than a thickness t3 of the vertical semiconductor pattern SP. As an example, the thicknesses t1, t2, and t3 may be values measured at the level of the lowermost electrode EL, as shown in FIG. 5, but example embodiments are not limited to this example. The thickness t3 of the vertical semiconductor pattern SP may be about 3 times to about 7 times the thickness t1 of the barrier pattern PD. As an example, the thickness t1 of the barrier pattern PD may be 5 Å to 20 Å (e.g. 0.5 nm to 2.0 nm). As an example, the thickness t3 of the vertical semiconductor pattern SP may be 30 Å to 70 Å (e.g. 3.0 nm to 7.0 nm).

The thickness t2 of the insulating gapfill pattern VI may be substantially uniform, as shown in FIG. 6, and in this case, the air gap OV may be disposed at a center portion of the vertical channel structure VS. Alternatively, in the case where, as shown in FIG. 7, the thickness of the insulating gapfill pattern VI is not uniform (e.g., t2">t2'), the air gap OV may be disposed at a region that is shifted from the center portion of the vertical channel structure VS. Further-more the air gap OV may or may not have a circular shape, when viewed in plan view.

During the etching process to form the source semicon-ductor layer SSL, the insulating gapfill pattern VI having a low etch resistant property may be partially removed by the etchant supplied through the vertical semiconductor pattern SP. For example, as an integration density of the semicon-ductor device increase, an aspect ratio of the vertical channel structure VS may increase, and in this case, the channel hole CH may not be fully filled and the air gap OV may be formed in a lower portion of the channel hole CH. In this case, the etchant may be supplied into the air gap OV through the insulating gapfill pattern VI and moreover may be supplied to other portion of the vertical channel structure VS through the air gap OV. Furthermore, in the process, e.g. a chemical vapor deposition (CVD) process, of forming the source semiconductor layer SSL, a semiconductor material may be provided to other inner portion of the vertical channel structures VS along the air gap OV. This may lead to an increase a process deviation in the process of forming the vertical channel structures VS or a reduction in reliability of the memory device.

According to some example embodiments of inventive concepts, the barrier pattern PD may be formed in the vertical channel structure VS and thus, it may be possible to prevent or reduce the likelihood of the etchant from being supplied to an undesired region. Accordingly, it may be possible to prevent or reduce the likelihood of the reliability of the semiconductor memory device from being deterio-rated.

FIGS. 10 to 14 are enlarged views, each of which illus-trates a lower portion (e.g., the portion M of FIG. 4) of the vertical channel structure VS according to some example embodiments of inventive concepts. For concise description, a previously described element may be identified by a similar or identical reference number without repeating an overlapping description thereof.

Figure 10:
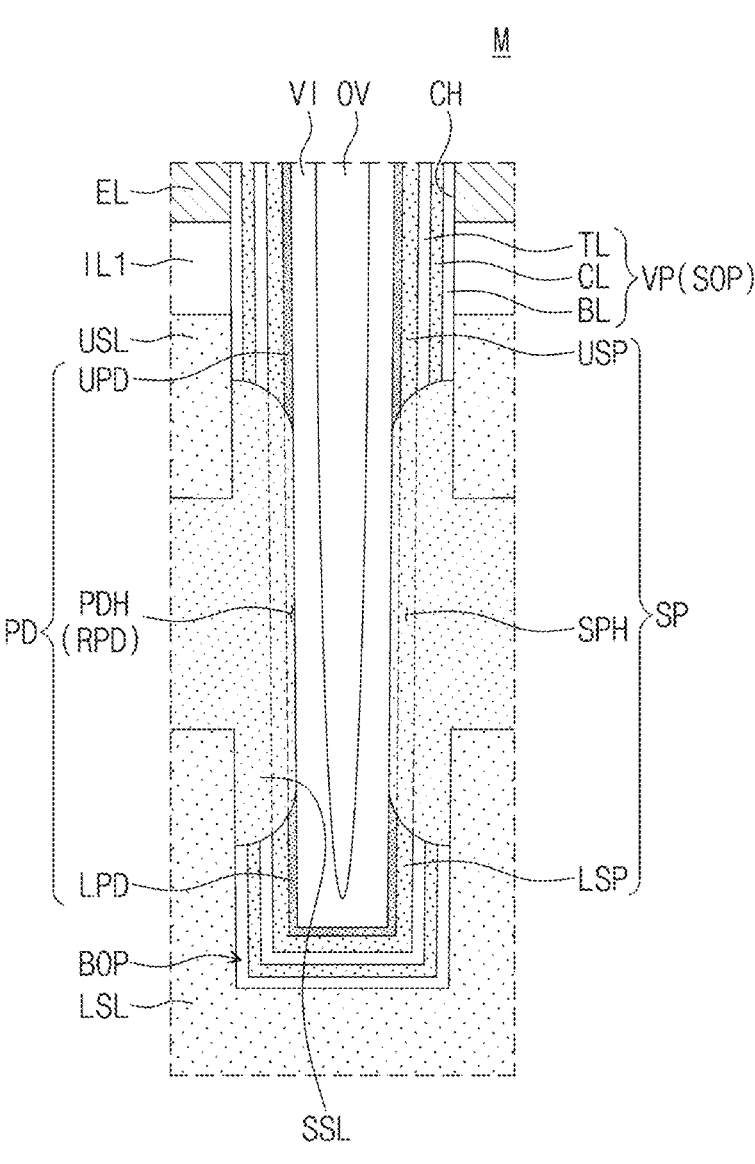
FIGS. 10 to 14 are enlarged views, each of which illustrates a lower portion (e.g., the portion M of FIG. 4) of a vertical channel structure according to some example embodiments of inventive concepts.

Referring to FIG. 10, the barrier pattern PD may include a second penetration hole PDH, similar to the first penetra-tion hole SPH of the vertical semiconductor pattern SP described with reference to FIGS. 5 to 9. The second penetration hole PDH may be configured to have substan-tially the same shape as the first penetration hole SPH described above; for example, the second penetration hole PDH may have a shape of a mushroom on its side. As an example, the barrier pattern PD may include a lower barrier pattern LPD and an upper barrier pattern UPD, which are completely separated from each other in the third direction D3 by the second penetration hole PDH. As another example, the second penetration hole PDH may be locally formed on a portion of the insulating gapfill pattern VI, similar to the first penetration hole SPH of FIG. 9, and a residual barrier pattern RPD may cover the remaining por-tion of the side surface of the insulating gapfill pattern VI. In this case, the lower barrier pattern LPD and the upper barrier pattern UPD may not be completely separated from each other by the second penetration hole PDH, and may be connected to each other by the residual barrier pattern RPD. The source semiconductor layer SSL may be extended into the first penetration hole SPH and the second penetration hole PDH to be in contact with the side surface of the insulating gapfill pattern VI.

Figure 11:
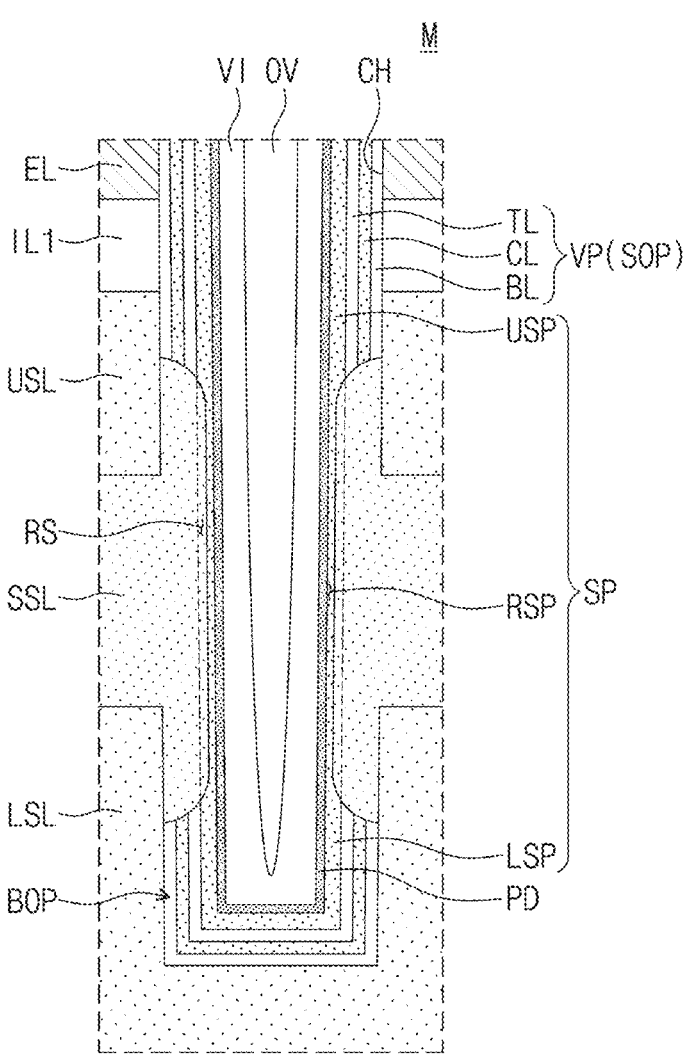

Referring to FIG. 11, the vertical semiconductor pattern SP may include a recess portion RS, which is formed at a lower portion thereof, and the source semiconductor layer SSL may be extended into the recess region. The recess portion RS may not penetrate the vertical semiconductor pattern SP, unlike the first penetration hole SPH described with reference to FIGS. 5 to 9. Thus, the residual semicon-ductor pattern RSP and the barrier pattern PD may be provided between the source semiconductor layer SSL and the insulating gapfill pattern VI. The residual semiconductor pattern RSP according to some example embodiments may not expose the barrier pattern PD, unlike the embodiment of FIG. 9. The residual semiconductor pattern RSP adjacent to the source semiconductor layer SSL may be thinner than the upper semiconductor pattern USP and may be thinner than the lower semiconductor pattern LSP.

Figure 12:
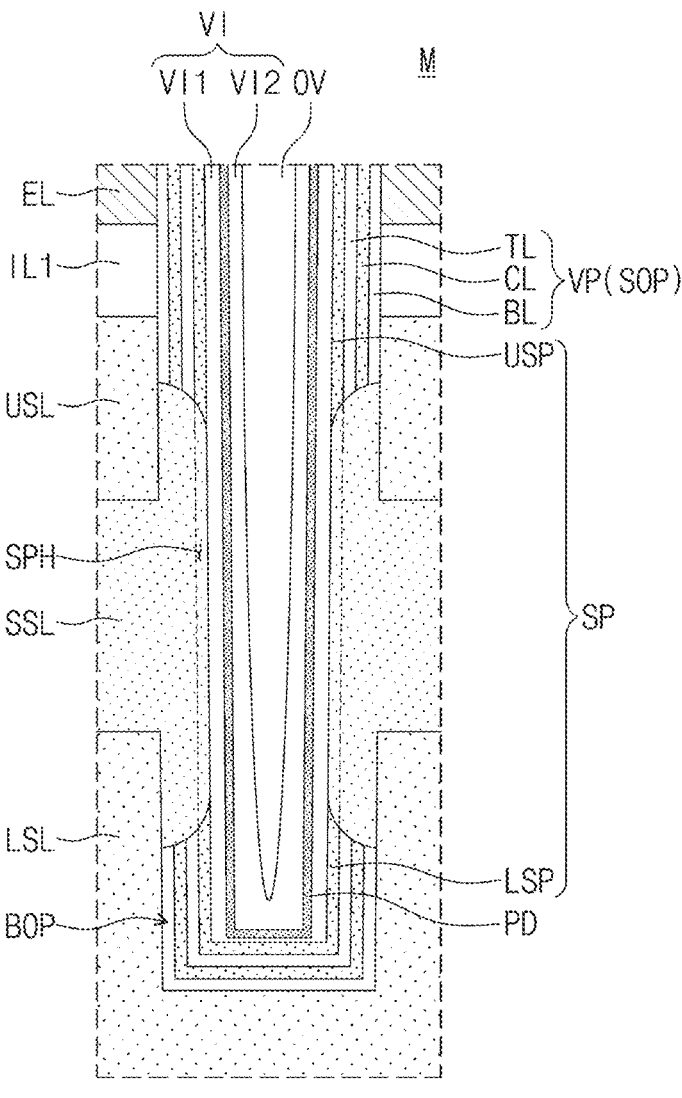

Referring to FIG. 12, the insulating gapfill pattern VI may include a first insulating gapfill pattern VI1 and a second insulating gapfill pattern VI2, and the barrier pattern PD may be provided between the first insulating gapfill pattern VI1 and the second insulating gapfill pattern VI2. The first insulating gapfill pattern VI1 and the second insulating gapfill pattern VI2 may be formed of or include substantially the same material, but example embodiments are not limited to this example. The barrier pattern PD may be spaced apart from the vertical semiconductor pattern SP and the source semiconductor layer SSL with the first insulating gapfill pattern VI1 interposed therebetween. The thickness of the barrier pattern PD may be smaller than a thickness of the first insulating gapfill pattern VI1 and may be smaller than a thickness of the second insulating gapfill pattern VI2. The source semiconductor layer SSL may be in contact with the side surface of the first insulating gapfill pattern VI1 or may pass through the first insulating gapfill pattern VI1 to be in contact with the side surface of the barrier pattern PD.

Referring to FIGS. 13 and 14, the air gap OV may be defined by the barrier pattern PD enclosing the same. As shown in FIG. 13, the insulating gapfill pattern VI may be provided between the barrier pattern PD and the vertical semiconductor pattern SP. In this case, the barrier pattern PD may be thicker than the insulating gapfill pattern VI. The source semiconductor layer SSL may be in contact with the side surface of the insulating gapfill pattern VI or may penetrate the insulating gapfill pattern VI to be in contact with the side surface of the barrier pattern PD. As shown in FIG. 14, the barrier pattern PD and the vertical semiconductor pattern SP may be in contact with, e.g. in direct contact with each other and, in this case, the insulating gapfill pattern VI may be omitted.

FIGS. 15 to 20 are sectional views illustrating a method of fabricating a three-dimensional semiconductor memory device, according to some example embodiments of inventive concepts, taken along the line I-I' of FIG. 3.

Figure 15:
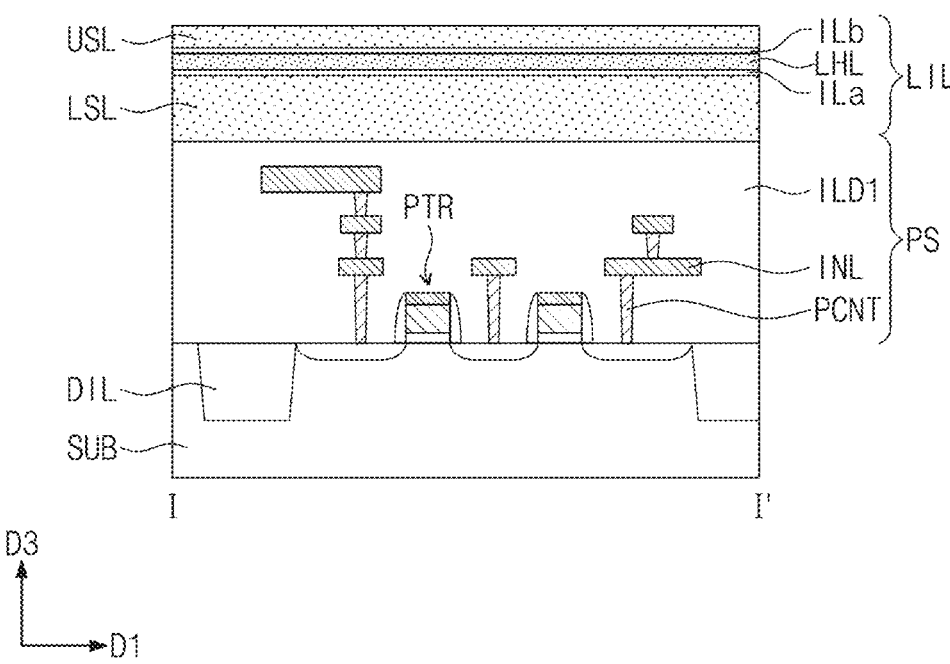
FIGS. 15 to 20 are sectional views illustrating a method of fabricating a three-dimensional semiconductor memory device, according to some example embodiments of inventive concepts, taken along the line I-I' of FIG. 3.

Referring to FIGS. 3 and 15, the peripheral circuit structure PS may be formed on the first substrate SUB. The formation of the peripheral circuit structure PS may include forming the peripheral transistors PTR on the first substrate SUB and forming the lower interconnection lines INL on the peripheral transistors PTR. For example, the formation of the peripheral transistors PTR may include forming the device isolation layer DIL on the first substrate SUB to define the active regions, and forming a gate insulating layer and a gate electrode on the active regions, and injecting (e.g., implanting) impurities into the active regions to form source/drain regions. Additionally, thermal processes such as annealing, e.g. annealing with a rapid thermal annealing (RTA) process, may occur to recrystallize the first substrate SUB and/or to activate the impurities injected into the first substrate SUB; however, example embodiments are not limited thereto. The first interlayer insulating layer ILD1 may be formed to cover the peripheral transistors PTR and the lower interconnection lines INL. The first insulating layer ILD1 may be formed with a CVD process such as a plasma enhanced CVD (PECVD) process; however, example embodiments are not limited thereto.

The lower semiconductor layer LSL may be formed on the first interlayer insulating layer ILD1. For example, the lower semiconductor layer LSL may be formed of or include at least one of semiconductor materials (e.g., doped or polysilicon), and may be formed with a CVD process such as a PECVD process including gases such as silane and/or disilane; however, example embodiments are not limited thereto. An insulating structure LIL may be formed on the lower semiconductor layer LSL. The formation of the insulating structure LIL may include sequentially forming a lower insulating layer ILa, a lower sacrificial layer LHL, and an upper insulating layer ILb on the lower semiconductor layer LSL. The upper and lower insulating layers ILa and ILb may be formed of or include silicon oxide, and the lower sacrificial layer LHL may be formed of or include at least one of silicon nitride or silicon oxynitride. The insulating structure LIL may be formed with a CVD process such as a PECVD process, and/or with an atomic layer deposition (ALD) process; however, example embodiments are not limited thereto.

The upper semiconductor layer USL may be conformally formed on the insulating structure LIL. For example, the upper semiconductor layer USL may be formed of or include at least one of semiconductor materials (e.g., polysilicon). Additionally the upper semiconductor layer USL may be planarized, e.g. planarized with an etch back and/or a chemical mechanical planarization (CMP) process; however, example embodiments are not limited thereto.

Figure 16:
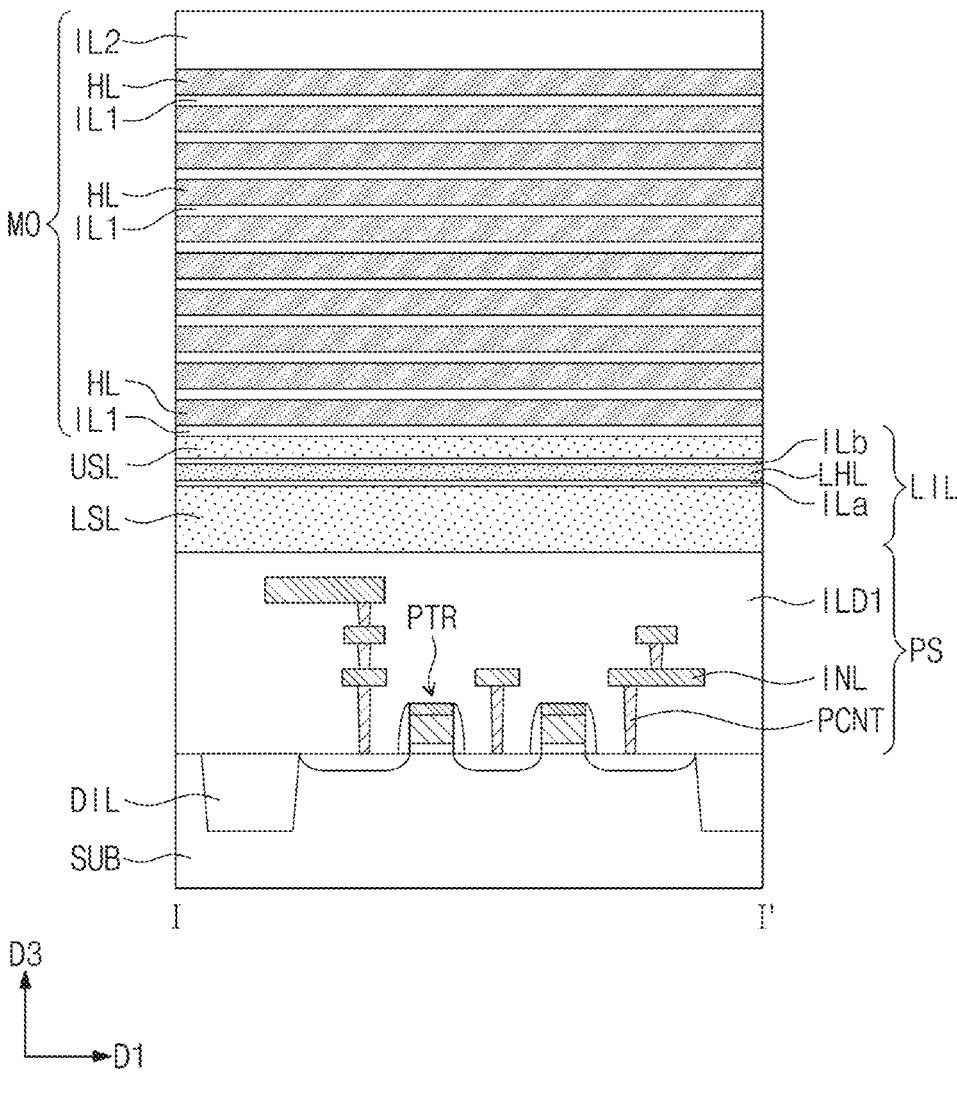
Figure 17:
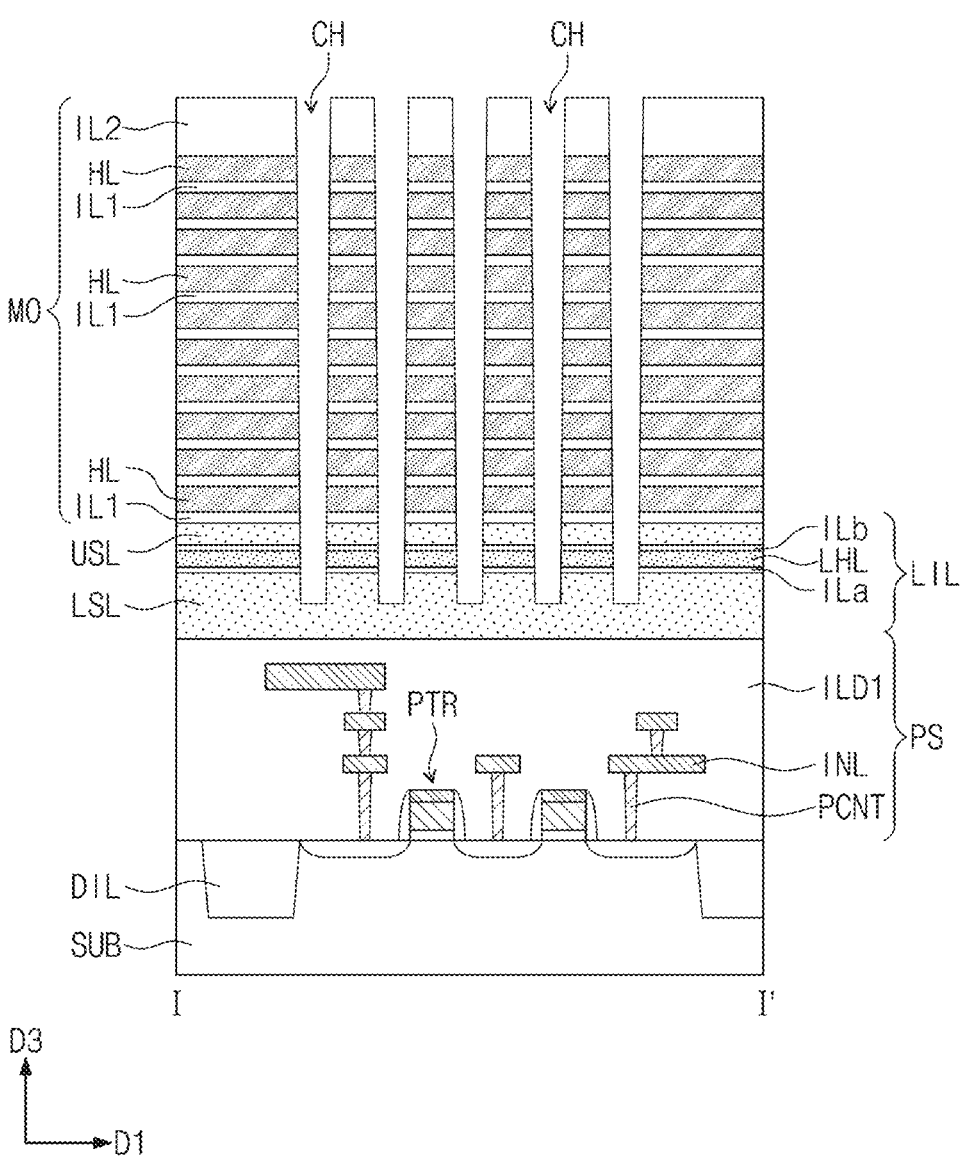

Referring to FIGS. 3 and 16, a mold structure MO may be formed on the upper semiconductor layer USL. In detail, the mold structure MO may be formed by alternately stacking the first insulating layers IL1 and sacrificial layers HL on the upper semiconductor layer USL. In some example embodiments, the second insulating layer IL2 may be formed as the topmost layer of the mold structure MO.

The first insulating layers IL1, the sacrificial layers HL, and the second insulating layer IL2 may be deposited using at least one of thermal chemical vapor deposition (TCVD), plasma-enhanced chemical vapor deposition (PECVD), physical vapor deposition (PVD), or atomic layer deposition (ALD) processes. The first and second insulating layers IL1 and IL2 may be formed of or include silicon oxide, and the sacrificial layers HL may be formed of or include at least one of silicon nitride or silicon oxynitride. A number of layers of the insulating layers IL1 and of the sacrificial layers HL are not limited to those illustrated in FIG. 16, Referring to FIGS. 3 and 17, the channel holes CH may be formed on the cell array region CAR to penetrate the mold structure MO. The channel holes CH may be formed to expose the lower semiconductor layer LSL. In detail, the formation of the channel holes CH may include forming a mask pattern, such as a soft mask pattern and/or a hard mask pattern (not illustrated) on the mold structure MO to have openings defining regions, in which holes will be formed, and anisotropically etching the mold structure MO using the mask pattern as an etch mask. The anisotropic etching process may include at least one of a plasma etching process, a reactive ion etching (RIE) process, an inductively-coupled-plasma reactive-ion-etching (ICP-RIE) process, or an ion beam etching (IBE) process.

When viewed in a plan view, the channel holes CH may be arranged in a specific direction or in a zigzag shape. The channel holes CH may be provided to have substantially the same planar arrangement as the vertical channel structures VS described with reference to FIG. 3.

Figure 18:
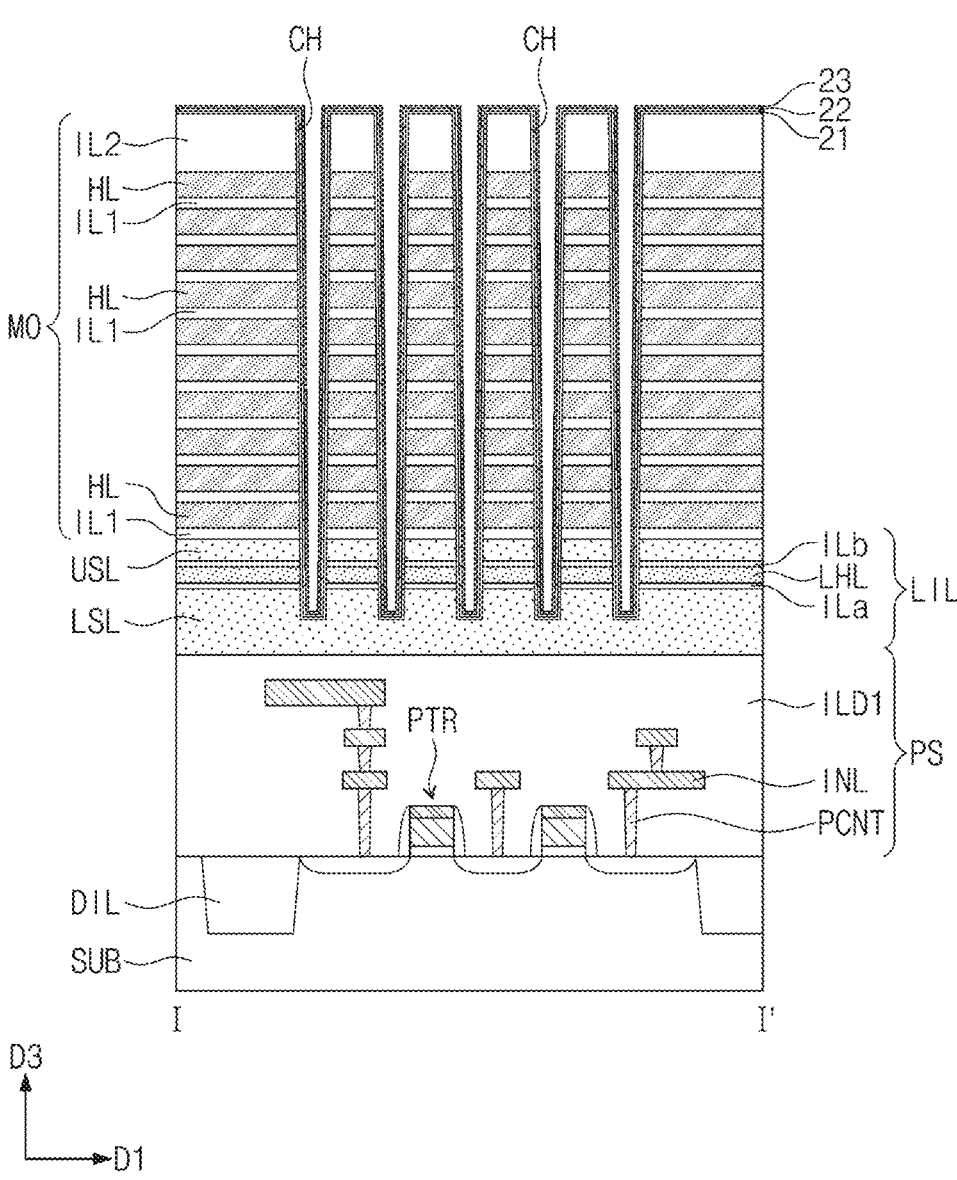

Referring to FIGS. 3 and 18, a vertical insulating layer 21, a vertical semiconductor layer 22, and a barrier layer 23 may be sequentially formed in the channel holes CH. The vertical insulating layer 21, the vertical semiconductor layer 22, and the barrier layer 23 may be conformally formed along an inner surface of each of the channel holes CH. The vertical insulating layer 21 may include the tunnel insulating layer TL, the charge storing layer CL, and the blocking insulating layer BL described with reference to FIG. 5. The vertical semiconductor layer 22 may include a doped or undoped poly-silicon layer. The vertical insulating layer 21, the vertical semiconductor layer 22 may be formed using at least one of thermal chemical vapor deposition, plasma-enhanced chemical vapor deposition, physical chemical vapor deposition, or atomic layer deposition processes.

The barrier layer 23 may be formed using an organic precursor which includes carbon. As an example, the deposition process may be performed using at least one of bis(ethlymethylamino)silane (BEMAS), bis(diethylamino) silane (BDEAS), bis(dimethylamino)silane (BDMAS), tris (dimethylamino)silane (Tris-DMAS), tetrakis(dimethylamino)silane (TDMAS), tris(ethlymethylamino)silane (Tris-EMAS), diethylaminosiliane (DEAS), bis(tertybutylamino) silane (BTBAS), or di-isopropyl-amino-silane (DIPAS) as a source material. The barrier layer 23 may be formed by a CVD and/or ALD process. As an example, the deposition process of the barrier layer 23 may be performed at temperature of about 400° C. to about 700° C. The deposition process of the barrier layer 23 may be performed in-situ in the same process chamber as that for a process of forming an insulating gapfill layer, which will be described below, but the inventive concept is not limited to this example.

Figure 19:
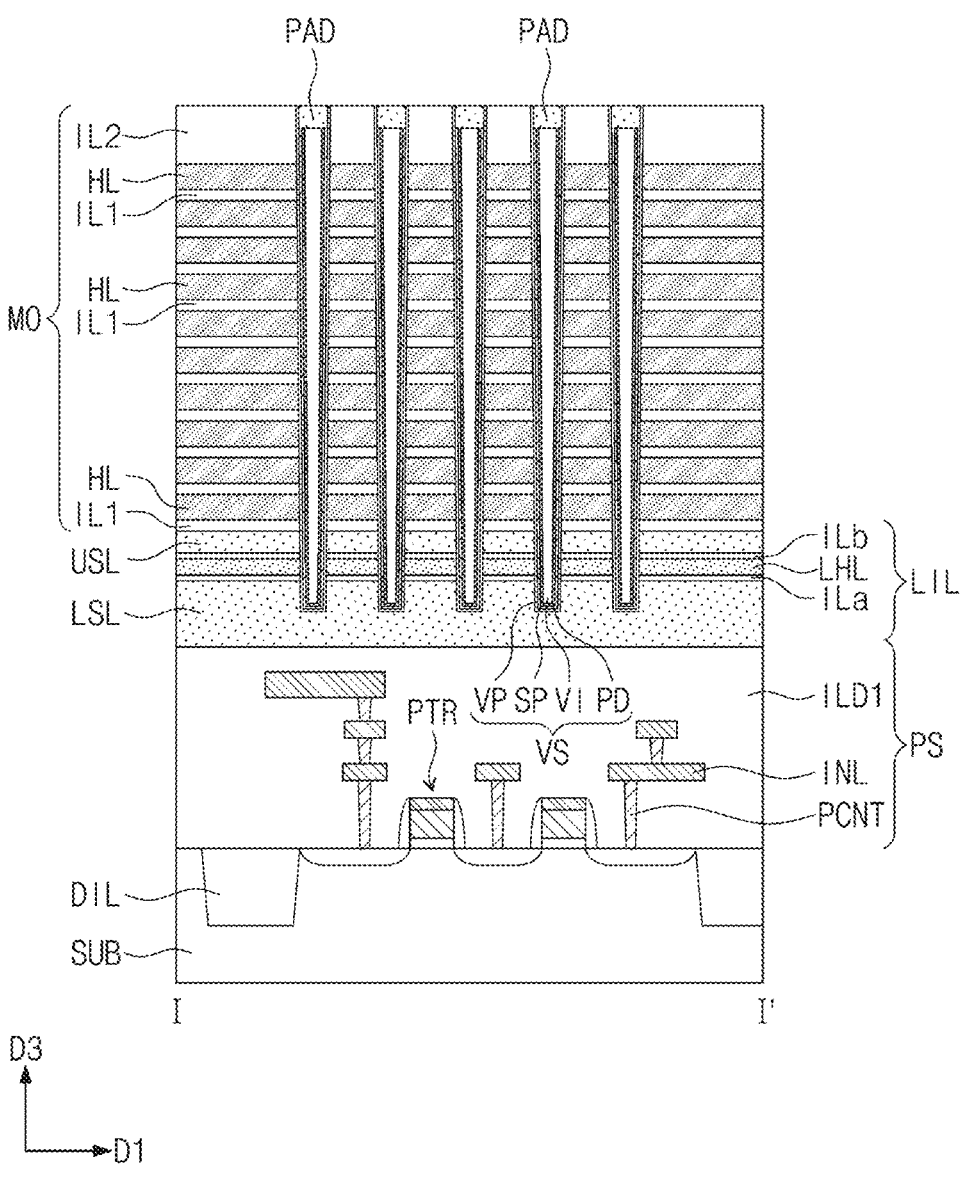

Referring to FIGS. 3 and 19, an insulating gapfill layer may be formed to fill the channel holes CH, and then, a planarization process may be performed to form the vertical channel structures VS, each of which includes the vertical insulating pattern VP, the vertical semiconductor pattern SP, the barrier pattern PD, and the insulating gapfill pattern VI. The planarization process may include an etch-back process and/or a CMP process. The conductive pad PAD may be formed on an upper portion of each of the vertical channel structures VS. The insulating gapfill layer may be formed of or include silicon oxide and/or silicon oxynitride. The conductive pad PAD may be formed of or include at least one of doped semiconductor materials and/or conductive materials, and may be formed with a CVD process and/or a PVD process.

Figure 20:
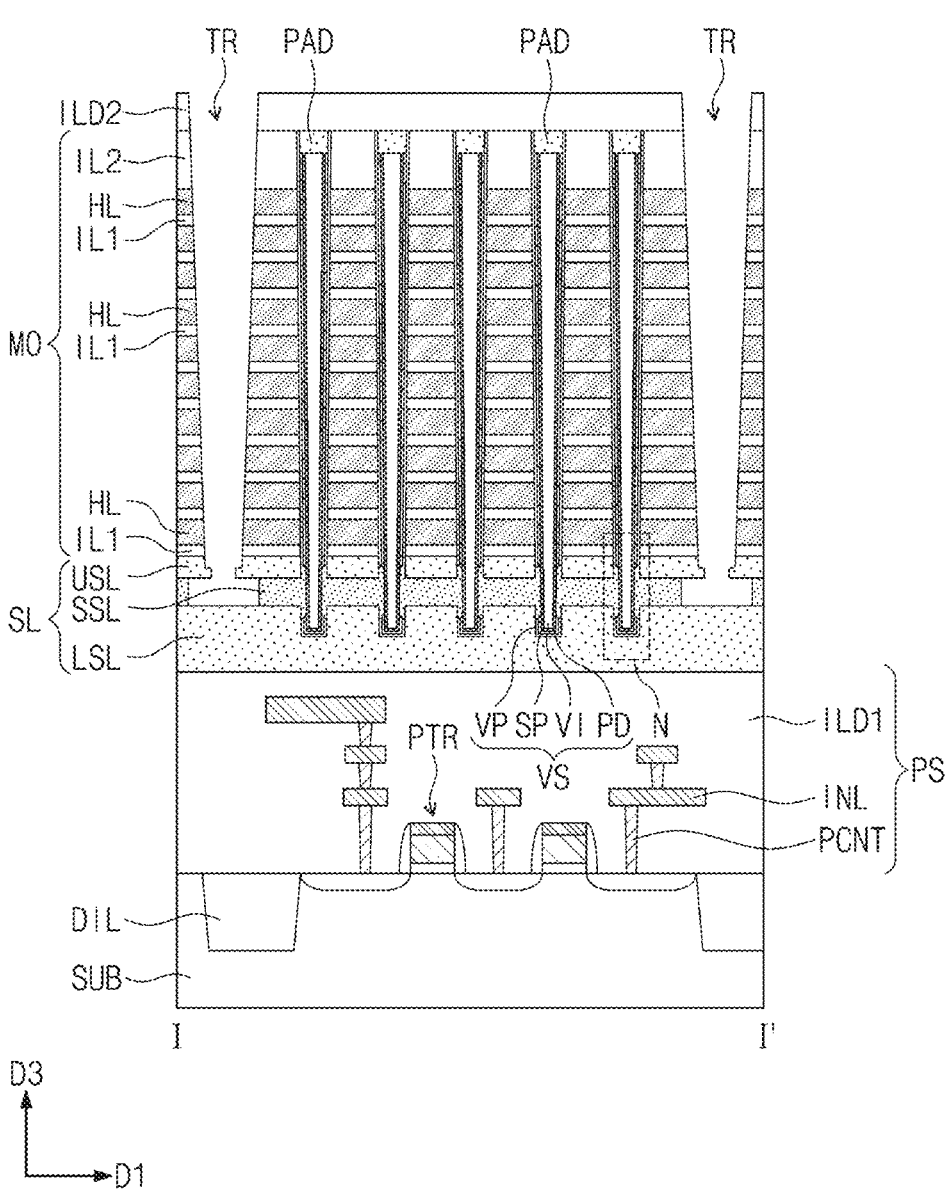

Referring to FIGS. 3 and 20, the second interlayer insulating layer ILD2 may be formed on the mold structure MO. The mold structure MO may be patterned to form trenches TR penetrating the mold structure MO. The trenches TR may be formed to have a shape corresponding to the separation structure SPS described with reference to FIGS. 3 to 5. The trenches TR may expose the lower sacrificial layer LHL. The lower sacrificial layer LHL exposed through the trenches TR may be replaced with the source semiconductor layer SSL. The source semiconductor layer may be formed with a CVD process. In detail, the lower sacrificial layer LHL may be selectively removed during the formation of the trenches TR.

Except for the electrode EL, a region N of FIG. 20 may have substantially the same structure as the region M described with reference to FIGS. 5 and 10 to 14. As a result of the removal of the lower sacrificial layer LHL, a lower portion of the vertical insulating pattern VP may be exposed. The exposed lower portion of the vertical insulating pattern VP may be removed to form an undercut region. The undercut region may be formed to expose a lower portion of the vertical semiconductor pattern SP. As described above, at least a portion of the lower portion of the vertical semiconductor pattern SP may be removed along with the lower portion of the vertical insulating pattern VP, and thus, the first penetration hole SPH and/or the recess portion RS may be formed as illustrated in FIGS. 5 and 10 to 14. In some example embodiments, the second penetration hole PDH penetrating the barrier pattern PD may be formed. The lower and upper insulating layers ILa and ILb may also be removed during the removing of the lower portion of the vertical insulating pattern VP.

The source semiconductor layer SSL may be formed in a space, from which the insulating structure LIL is removed. The source semiconductor layer SSL may be in contact with the vertical semiconductor pattern SP. In detail, the source semiconductor layer SSL may be in contact with an upper portion of the lower semiconductor pattern LSP and a lower portion of the upper semiconductor pattern USP, as shown in FIGS. 5 and 10, or may be in contact with the residual semiconductor pattern RSP, as shown in FIG. 11. The lower semiconductor layer LSL, the source semiconductor layer SSL, and the upper semiconductor layer USL may constitute or correspond to the second substrate SL. Each of or at least some of the lower semiconductor layer LSL, the source semiconductor layer SSL, and the upper semiconductor layer USL may be single-crystalline phase and/or polycrystalline phase.

Referring back to FIGS. 3 to 5, the electrode structure ST may be formed by replacing the sacrificial layers HL, which are exposed through the trenches TR, with the electrodes EL respectively. In detail, the sacrificial layers HL, which are exposed through the trenches TR, may be selectively removed. The electrodes EL may be formed in spaces, from which the sacrificial layers HL are removed. Thereafter, the trenches TR may be filled with an insulating material, and thus, the separation structure SPS may be formed in each of the trenches TR. The bit line contact plugs BPLG may be formed to penetrate the second interlayer insulating layer ILD2 and to be coupled to the conductive pads PAD, respectively. The bit lines BIL, which are electrically connected to the bit line contact plugs BPLG, may be formed on the second interlayer insulating layer ILD2.

Figure 21:
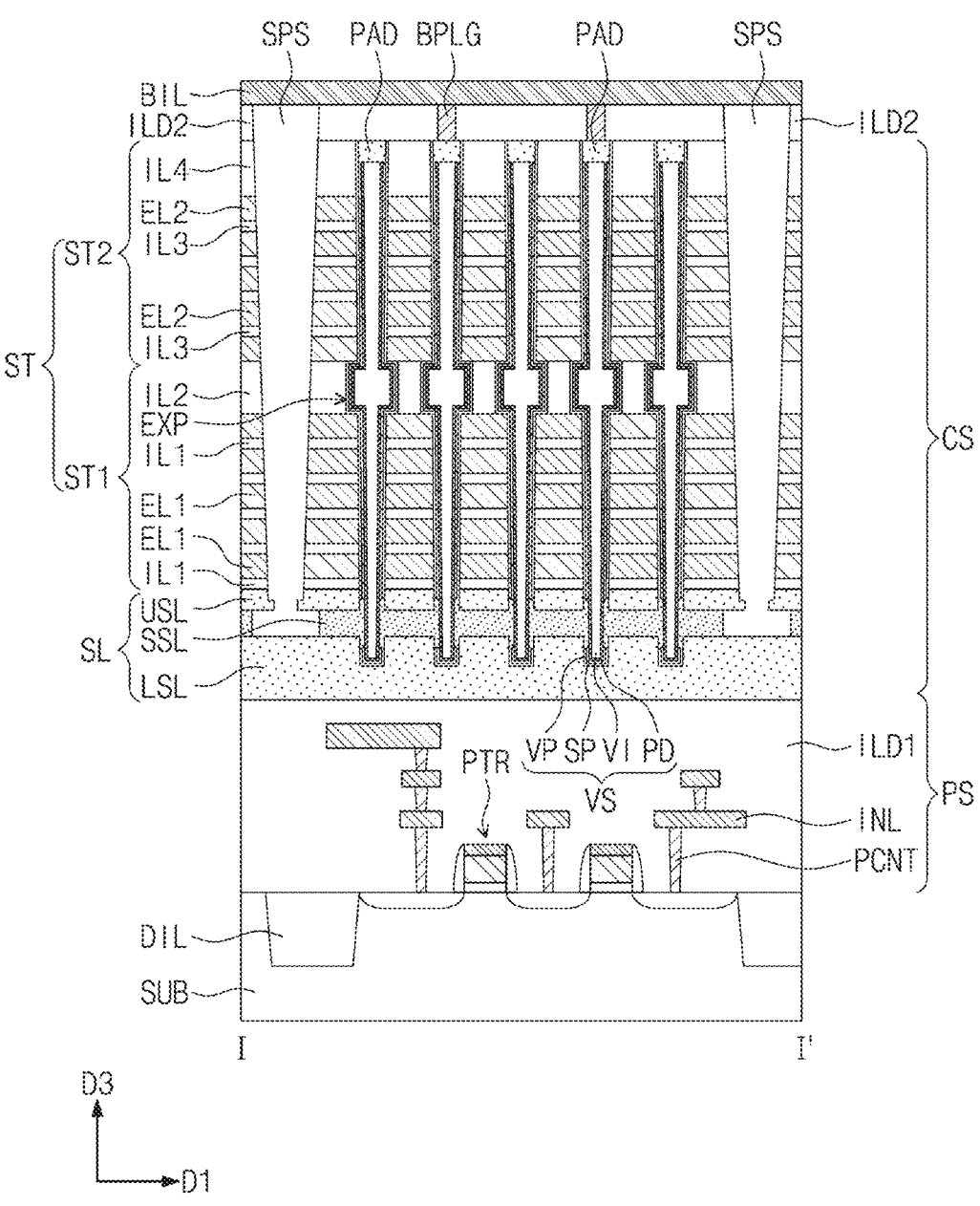
FIG. 21 is a sectional view illustrating a semiconductor memory device according to some example embodiments of inventive concepts, taken along the line I-I' of FIG. 3.

FIG. 21 is a sectional view illustrating a semiconductor memory device according to some example embodiments of inventive concepts, taken along the line I-I' of FIG. 3. In the following description of example embodiments, an element previously described with reference to FIGS. 3 to 5 may be identified by the same reference number without repeating an overlapping description thereof.

Referring to FIGS. 3 and 21, the electrode structure ST on the second substrate SL may include a first electrode structure ST1 and a second electrode structure ST2 on the first electrode structure ST1. The first electrode structure ST1 may include first electrodes EL1, which are stacked in a direction (i.e., the third direction D3) perpendicular to the second substrate SL. The first electrode structure ST1 may further include the first insulating layers IL1, each of which is interposed between each adjacent pair of the first electrodes EL1 stacked. In the first electrode structure ST1, the first insulating layers IL1 and the first electrodes EL1 may be alternately stacked in the third direction D3. The second insulating layer IL2 may be provided as the topmost layer of the first electrode structure ST1. The second insulating layer IL2 may be thicker than each of the first insulating layers IL1.

The second electrode structure ST2 may include second electrodes EL2, which are stacked on the first electrode structure ST1 in the third direction D3. The second electrode structure ST2 may include third insulating layers IL3, each of which is interposed between each adjacent pair of the second electrodes EL2 stacked. In the second electrode structure ST2, the third insulating layers IL3 and the second electrodes EL2 may be alternately stacked in the third direction D3. A fourth insulating layer IL4 may be provided as the topmost layer of the second electrode structure ST2.

The fourth insulating layer IL4 may be thicker than each of the third insulating layers IL3.

Each of the vertical channel structures VS may include a first vertical extended portion penetrating the first electrode structure ST1, a second vertical extended portion penetrating the second electrode structure ST2, and an expanded portion EXP between the first and second vertical extended portions. The expanded portion EXP may be provided in the second insulating layer IL2. The diameter of the vertical channel structure VS may be abruptly increased at the level of the expanded portion EXP.

According to some example embodiments of inventive concepts, it may be possible to reduce a process deviation in a process of forming vertical channel structures and to improve reliability of a semiconductor memory device.

While some example embodiments of inventive concepts have been particularly shown and described, it will be understood by one of ordinary skill in the art that variations in form and detail may be made therein without departing from the spirit and scope of the attached claims. Further, although some example embodiments are illustrated in various figures as having some features not illustrated in other figures, unless otherwise stated example embodiments are not meant to be construed as mutually exclusive embodiments. For example, some example embodiments may have features associated with different example figures.

What is claimed is:

1. A semiconductor memory device, comprising:
an electrode structure including electrodes, the electrodes stacked on a substrate;
a source semiconductor layer between the substrate and the electrode structure; and
a vertical channel structure penetrating the electrode structure,
wherein the vertical channel structure includes,
a vertical insulating pattern,
a vertical semiconductor pattern spaced apart from the electrode structure with the vertical insulating pattern interposed between the vertical semiconductor pattern and the electrode structure; and
a barrier pattern spaced apart from the electrode structure with the vertical semiconductor pattern interposed between the barrier pattern and the electrode structure,
the vertical semiconductor pattern comprises a recess region, the source semiconductor layer extending in the recess region,
the barrier pattern includes an insulating layer including carbon,
the semiconductor memory device further comprises an insulating gapfill pattern spaced apart from the vertical semiconductor pattern, the barrier pattern interposed between the vertical semiconductor pattern and the insulating gapfill pattern, and
the barrier pattern contacts a side surface of the source semiconductor layer.

2. The semiconductor memory device of claim 1, wherein the recess region has a first penetration hole, and
the source semiconductor layer protrudes toward the insulating gapfill pattern through the first penetration hole.

3. The semiconductor memory device of claim 2, wherein the barrier pattern extends along the side surface of the source semiconductor layer.

4. The semiconductor memory device of claim 3, wherein the insulating gapfill pattern comprises a first insulating gapfill pattern and a second insulating gapfill pattern, and the barrier pattern is between the first insulating gapfill pattern and the second insulating gapfill pattern.

5. The semiconductor memory device of claim 1, wherein the recess region has a first penetration hole,
the barrier pattern has a second penetration hole, and
the source semiconductor layer extends into the first penetration hole and the second penetration hole, and
the source semiconductor layer connects to the insulating gapfill pattern.

6. The semiconductor memory device of claim 1, wherein the vertical channel structure further comprises an air gap in the insulating gapfill pattern, and
at least a portion of the air gap is at a same level as the source semiconductor layer.

7. The semiconductor memory device of claim 1, wherein the barrier pattern is thinner than the insulating gapfill pattern and is thinner than the vertical semiconductor pattern.

8. The semiconductor memory device of claim 1, wherein a thickness of the vertical semiconductor pattern is 3 times to 7 times a thickness of the barrier pattern.

9. The semiconductor memory device of claim 1, wherein a thickness of the barrier pattern is in a range of 0.5 nm to 2.0 nm, and
a thickness of the vertical semiconductor pattern is in a range of 3.0 nm to 7.0 nm.

10. The semiconductor memory device of claim 1, wherein the barrier pattern comprises at least one of SiC, SiCN, or SiOC.

11. The semiconductor memory device of claim 10, wherein a carbon concentration of the barrier pattern is in a range of about 1.5 at % to about 4.0 at %.

12. A semiconductor memory device, comprising:
an electrode structure including electrodes, the electrodes stacked on a substrate;
a source semiconductor layer between the substrate and the electrode structure; and
a vertical channel structure penetrating the electrode structure,
wherein the vertical channel structure includes,
a vertical insulating pattern,
a vertical semiconductor pattern spaced apart from the electrode structure with the vertical insulating pattern interposed between the vertical semiconductor pattern and the electrode structure and, and
a barrier pattern spaced apart from the vertical insulating pattern with the vertical semiconductor pattern interposed between the barrier pattern and the electrode structure,
the source semiconductor layer sequentially penetrates the vertical insulating pattern and the vertical semiconductor pattern and protrudes toward the barrier pattern,
the barrier pattern extends along a side surface of the vertical semiconductor pattern, wherein
the vertical semiconductor pattern comprises a residual semiconductor pattern having a penetration hole, an upper semiconductor pattern on the residual semiconductor pattern, and a lower semiconductor pattern under the residual semiconductor pattern,
the upper semiconductor pattern and the lower semiconductor pattern connect to each other through the residual semiconductor pattern, and
the source semiconductor layer has a first vertical interface with the vertical semiconductor pattern and a second vertical interface with the vertical insulating pattern.

13. The semiconductor memory device of claim 12, wherein the vertical semiconductor pattern is divided into the upper semiconductor pattern and the lower semiconductor pattern by the penetration hole.

14. The semiconductor memory device of claim 12, wherein the vertical channel structure further comprises an insulating gapfill pattern spaced apart from the vertical insulating pattern with the barrier pattern interposed between the insulating gapfill pattern and the vertical insulating pattern, and the barrier pattern has a higher etch resistance than the insulating gapfill pattern.

15. The semiconductor memory device of claim 14, wherein a carbon concentration of the barrier pattern is greater than a carbon concentration of the insulating gapfill pattern.

16. A semiconductor memory device, comprising:

an electrode structure including electrodes, the electrodes stacked on a substrate;

a source semiconductor layer between the substrate and the electrode structure; and a vertical channel structure penetrating the electrode structure, wherein the vertical channel structure includes, a vertical insulating pattern, a vertical semiconductor pattern spaced apart from the electrode structure with the vertical insulating pattern interposed between the vertical semiconductor pattern and the electrode structure; and a barrier pattern spaced apart from the electrode structure with the vertical semiconductor pattern interposed between the barrier pattern and the electrode structure, the vertical semiconductor pattern comprises a recess region, the source semiconductor layer extending in the recess region, the barrier pattern includes an insulating layer including carbon, the recess region has a first penetration hole, the barrier pattern has a second penetration hole, the source semiconductor layer extends into the first penetration hole and the second penetration hole, and the source semiconductor layer connects to an insulating gapfill pattern, and the source semiconductor layer has a first vertical interface with the vertical semiconductor pattern and a second vertical interface with the insulating gapfill pattern.

17. The semiconductor memory device of claim 16, wherein a thickness of the barrier pattern is in a range of 0.5 nm to 2.0 nm, and a thickness of the vertical semiconductor pattern is in a range of 3.0 nm to 7.0 nm.

18. The semiconductor memory device of claim 16, wherein the barrier pattern comprises at least one of SiC, SICN, or SIOC.

19. The semiconductor memory device of claim 1, wherein a first vertical surface of the source semiconductor layer contacts a vertical surface of the vertical semiconductor pattern and a second vertical surface of the source semiconductor layer contacts a vertical surface of the insulating gapfill pattern.

* * * * *